US012757773B2

(12) United States Patent
Cheng et al.

(10) Patent No.: US 12,757,773 B2
(45) Date of Patent: Oct. 6, 2026

(54) PACKAGE STRUCTURE INCLUDING A PACKAGE SUBSTRATE AND METHODS OF FORMING THE SAME

(71) Applicant: Taiwan Semiconductor Manufacturing Company Limited, Hsinchu (TW)

(72) Inventors: Chia-Jen Cheng, Banciao City (TW); Kuo-Ching Hsu, Taipei (TW); Mirng-Ji Lii, Sinpu Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 380 days.

(21) Appl. No.: 18/393,829

(22) Filed: Dec. 22, 2023

(65) Prior Publication Data

US 2025/0210484 A1 Jun. 26, 2025

(51) Int. Cl.
*H01L 23/495* (2006.01)
*H10W 46/00* (2026.01)
(Continued)

(52) U.S. Cl.
CPC ......... *H10W 70/685* (2026.01); *H10W 46/00* (2026.01); *H10W 70/05* (2026.01);
(Continued)

(58) Field of Classification Search
CPC . H10W 70/658; H10W 90/701; H10W 70/69; H10W 70/05; H10W 90/724; H10W 74/15; H10W 90/734; H10W 90/754; H10W 90/401; H10W 72/072; H10W 70/60; H10W 70/635; H10W 72/20; H10W 72/244; H10W 72/90; H10W 72/07236; H10W 72/07533; H10W 72/012; H10W 72/59; H10W 72/859; H10W 72/07532; H10W 20/20; H10W 72/07336; H10W 72/07331; H10W 90/20; H10W 90/26; H10W 90/735; H10W 90/752; H10W 72/00; H10W 72/075; H10W 72/877;
(Continued)

(56) References Cited

U.S. PATENT DOCUMENTS

2010/0065322 A1* 3/2010 Ogawa ................. H05K 1/0313 156/60
2012/0234589 A1* 9/2012 Furuichi .............. H05K 3/4682 29/837

(Continued)

*Primary Examiner* — Niki H Nguyen
(74) *Attorney, Agent, or Firm* — The Marbury Law Group, PLLC

(57) ABSTRACT

A package substrate includes a dielectric layer structure including a first dielectric layer and a second dielectric layer, a plurality of bonding pads located at a lower surface of the first dielectric layer, a plurality of metal pillars located on an upper surface of the second dielectric layer, and a metal interconnect structure extending from the plurality of bonding pads to the plurality of metal pillars and including a plurality of first metal vias in the first dielectric layer and a plurality of second metal vias in the second dielectric layer, wherein the plurality of first metal vias and the plurality of second metal vias have a cross-sectional diameter that decreases in a direction from the second dielectric layer to the first dielectric layer.

20 Claims, 27 Drawing Sheets

(51) Int. Cl.
*H10W 70/05* (2026.01)
*H10W 70/685* (2026.01)
*H10W 70/69* (2026.01)
*H10W 90/00* (2026.01)

(52) U.S. Cl.
CPC ......... *H10W 70/69* (2026.01); *H10W 90/701* (2026.01); *H10W 46/401* (2026.01); *H10W 90/724* (2026.01)

(58) Field of Classification Search
CPC . H10W 70/65; H10W 90/722; H10W 70/041; H10W 74/129; H10W 70/657; H10W 72/856; H10W 72/923; H10W 72/29; H10W 70/63; H10W 72/30; H10W 72/865; H10H 20/857; H10H 20/0364; H05K 1/113; H05K 3/34; H05K 3/3473; H05K 2201/10734; H05K 3/42
See application file for complete search history.

(56) References Cited

U.S. PATENT DOCUMENTS

| | | | | |
|---|---|---|---|---|
| 2013/0008705 | A1* | 1/2013 | Tseng | H05K 1/111 29/829 |
| 2022/0077066 | A1* | 3/2022 | Kim | H10P 72/74 |
| 2023/0386945 | A1* | 11/2023 | Hung | H10W 40/22 |
| 2023/0395519 | A1* | 12/2023 | Yew | H10W 70/611 |

* cited by examiner

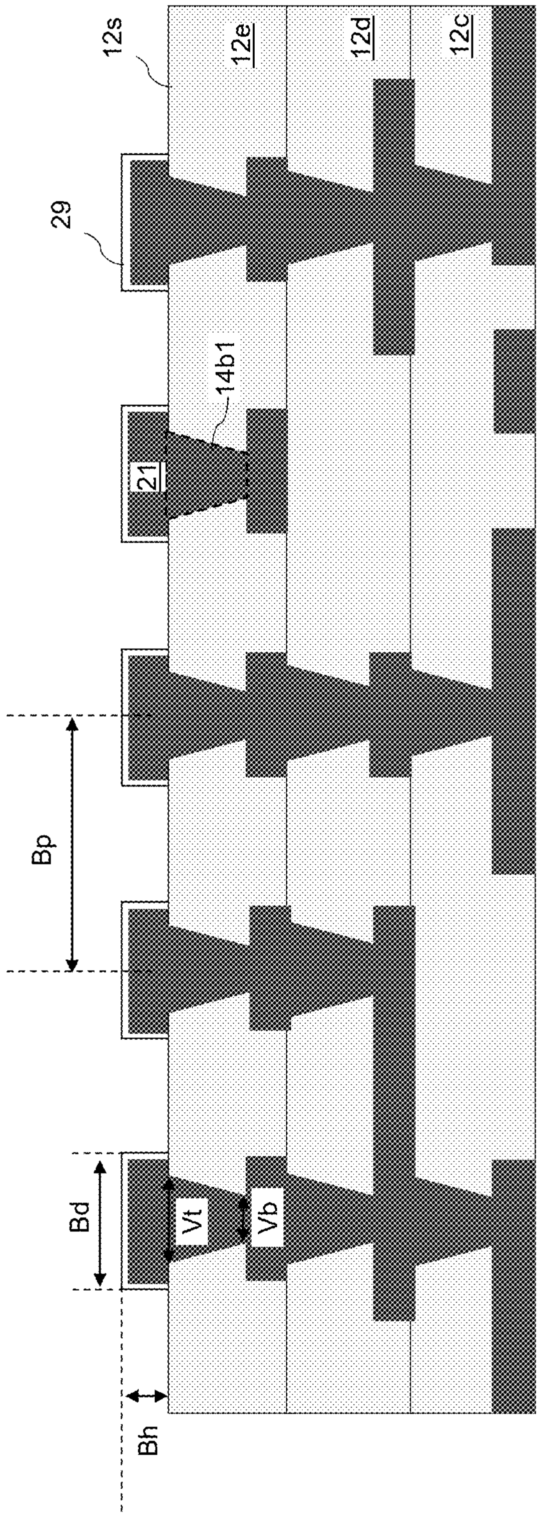
FIG. 2A
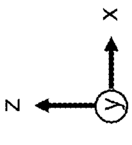

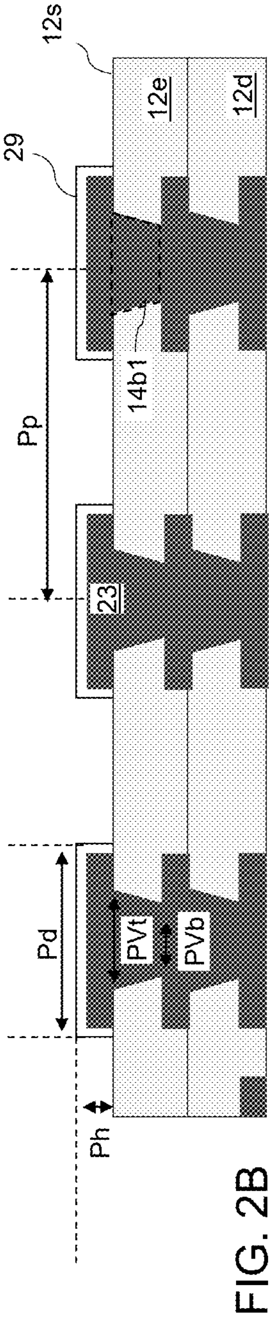
FIG. 2B
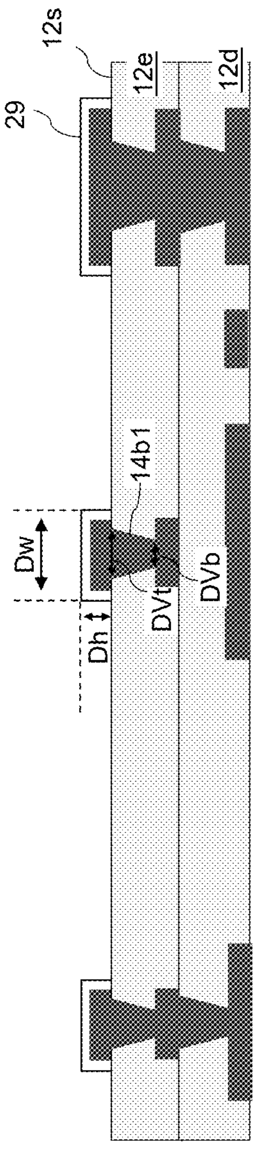
FIG. 2C
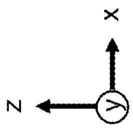

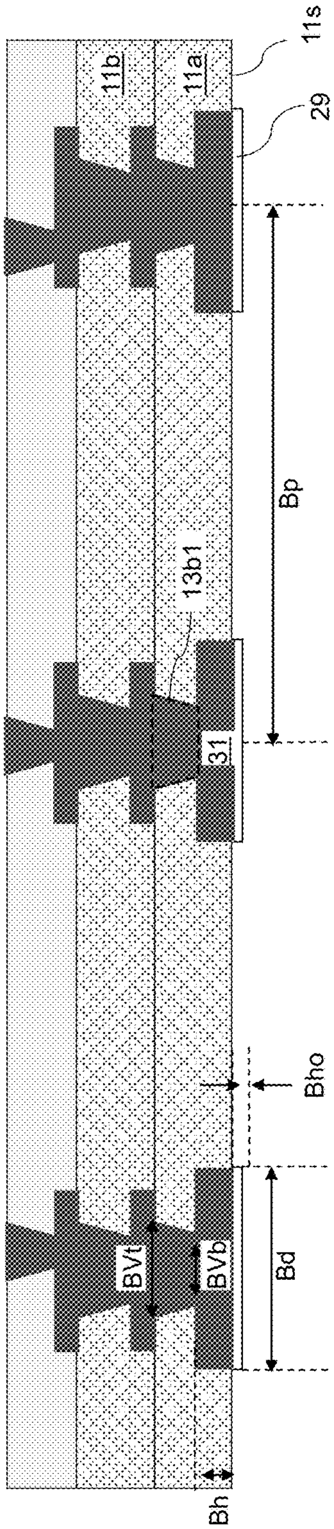
FIG. 2F
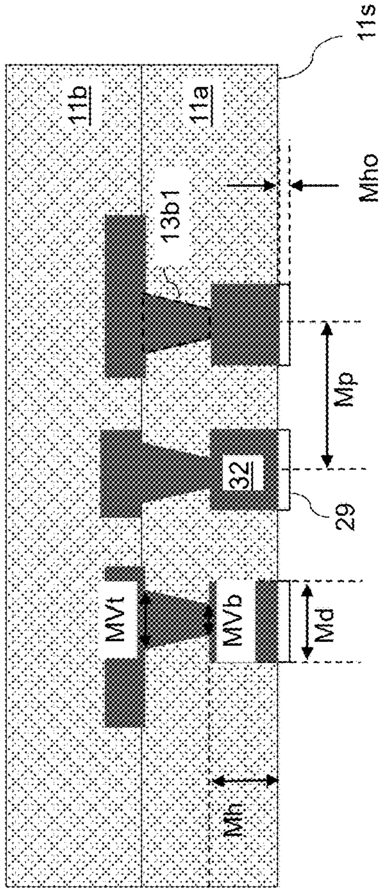
FIG. 2G
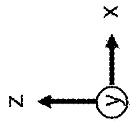

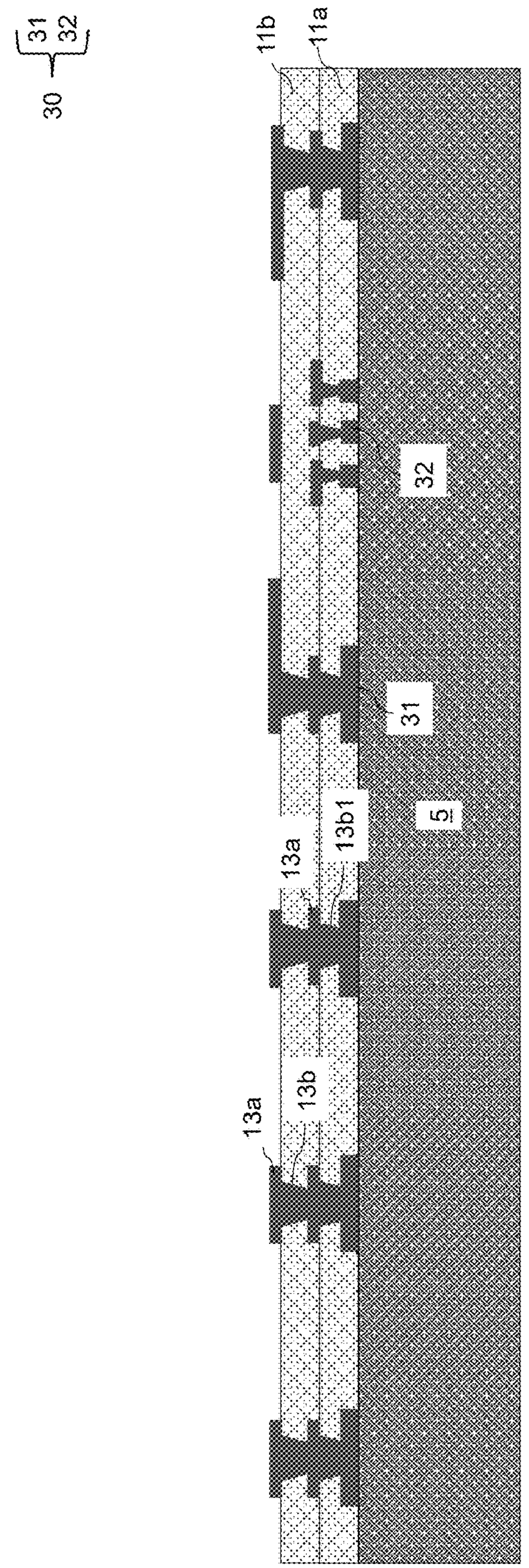
FIG. 3D
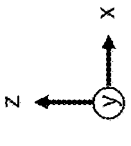

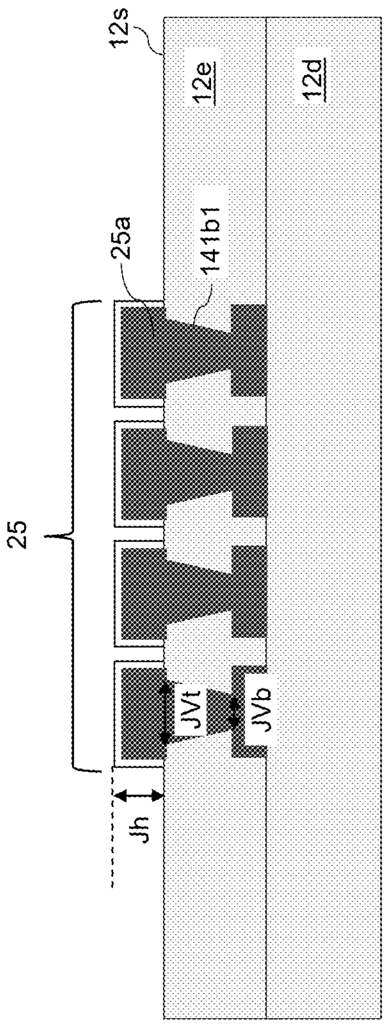
FIG. 6B
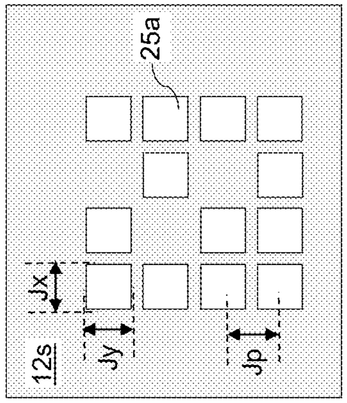
FIG. 6C
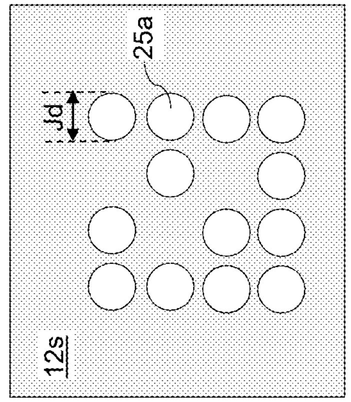
FIG. 6D
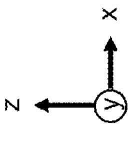

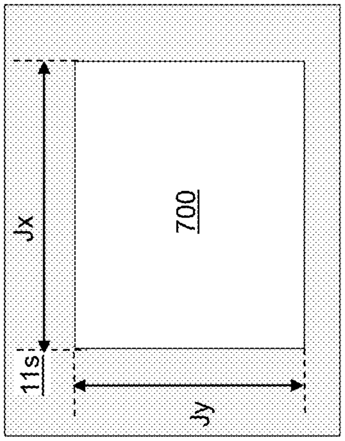
FIG. 7C
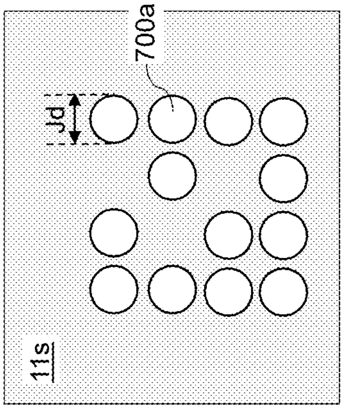
FIG. 7E
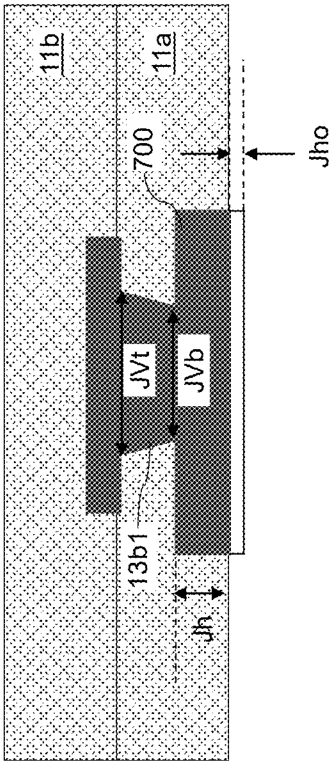
FIG. 7B
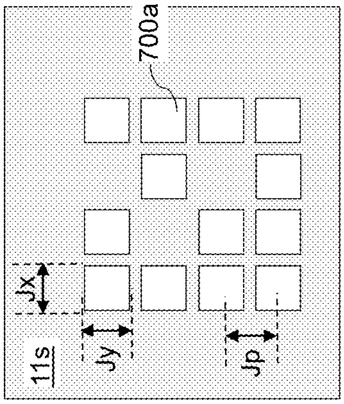
FIG. 7D
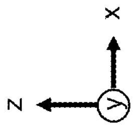

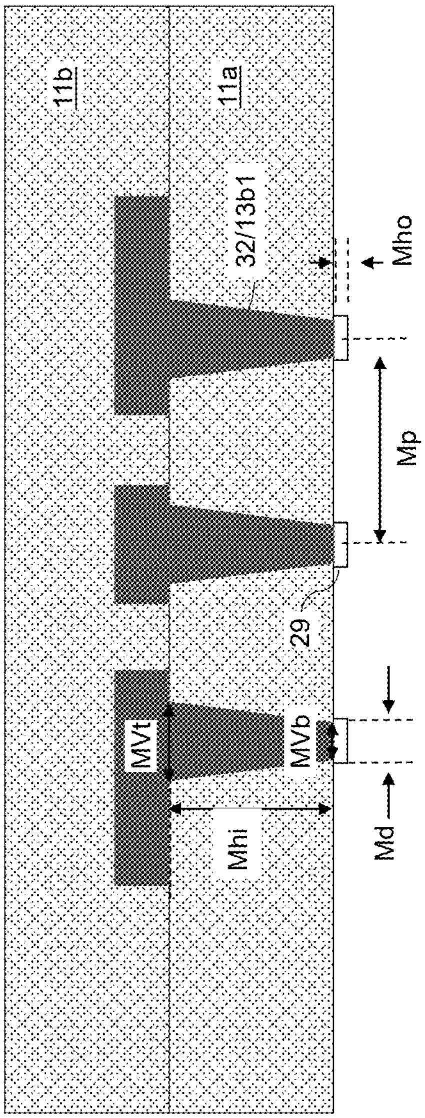
FIG. 8B
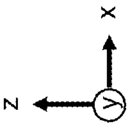

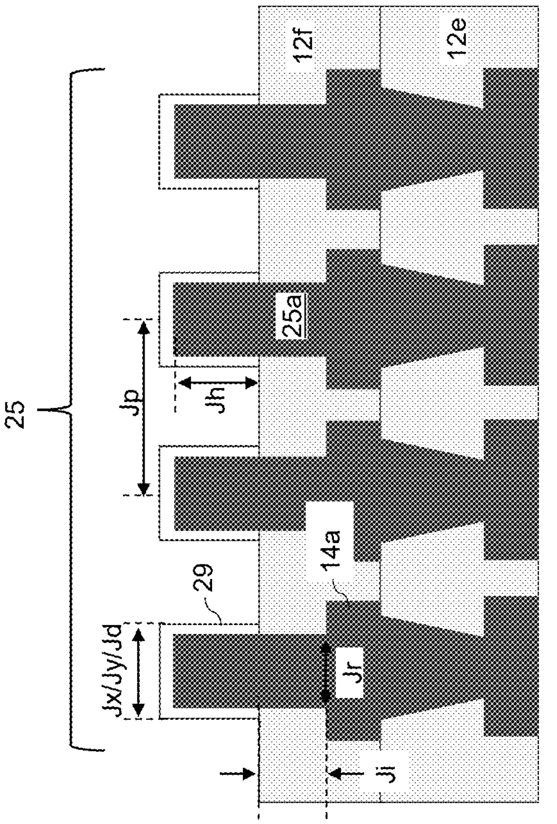
FIG. 9F
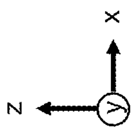

PACKAGE STRUCTURE INCLUDING A PACKAGE SUBSTRATE AND METHODS OF FORMING THE SAME

BACKGROUND

A package structure may include a package substrate that provides structural support and electrical connectivity for integrated circuits (ICs) and other electronic components. The package structure may include a core and one or more dielectric layers on each of the opposing sides of the core. The package substrate may serve as a platform to mount and interconnect various electronic components within the package structure.

The core may include a rigid central layer of the package substrate. The core may provide mechanical support and electrical insulation to the package substrate. The core may be made, for example, of an epoxy-based composite material reinforced with woven glass fibers, bismaleimide triazine (BT resin), polytetrafluoroethylene (PTFE), a ceramic material or a metal such as aluminum or copper.

The core may include one or more vias (small holes) extending between the opposing sides of the core. The vias may be filled with conductive material such as copper. The vias may enable vertical connections between different layers of the package substrate, allowing signals to pass from one layer to another.

Copper traces (thin copper layers) may be formed in the dielectric layers on the opposing sides of the core. The copper traces may be used to route electrical signals between different parts of the package structure, such as between the ICs, external pins, and other components. The copper traces may be patterned to create a network of interconnections.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a vertical cross-sectional view of the C4 metal bumps according to one or more embodiments.

FIG. 2B is a vertical cross-sectional view of the CSP pads according to one or more embodiments.

FIG. 2C is a vertical cross-sectional view of the metal dam according to one or more embodiments.

FIG. 2F is a vertical cross-sectional view of the BGA bonding pads according to one or more embodiments.

FIG. 2G is a vertical cross-sectional view of the lower SMD pads according to one or more embodiments.

FIG. 3D is a vertical cross-sectional view of an intermediate structure including first metal traces and the lowermost first metal vias according to an embodiment of the present invention.

FIG. 6B is a vertical cross-sectional view of the upper 2DID pad according to an embodiment of the present invention.

FIG. 6C is a plan view (top down view) of the plurality of identification pads having a square shape according to an embodiment of the present invention.

FIG. 6D is a plan view (top down view) of the plurality of identification pads having a circular shape according to an embodiment of the present invention.

FIG. 7B is a vertical cross-sectional view of a lower 2DID pad in the package substrate according to an embodiment of the present invention.

FIG. 7C is a plan view (bottom-up view) of the lower 2DID pad having a single square shape according to an embodiment of the present invention.

FIG. 7D is a plan view (bottom-up view) of the lower 2DID pad having a plurality of identification pads with a square shape according to an embodiment of the present invention.

FIG. 7E is a plan view (bottom-up view) of the plurality of identification pads having a circular shape according to an embodiment of the present invention.

FIG. 8B is a vertical cross-sectional view of the lower SMD pads in the package substrate according to an embodiment of the present invention.

FIG. 9F is a vertical cross-sectional view of the upper 2DID pad according to one or more embodiments.

DETAILED DESCRIPTION

Figure 1:
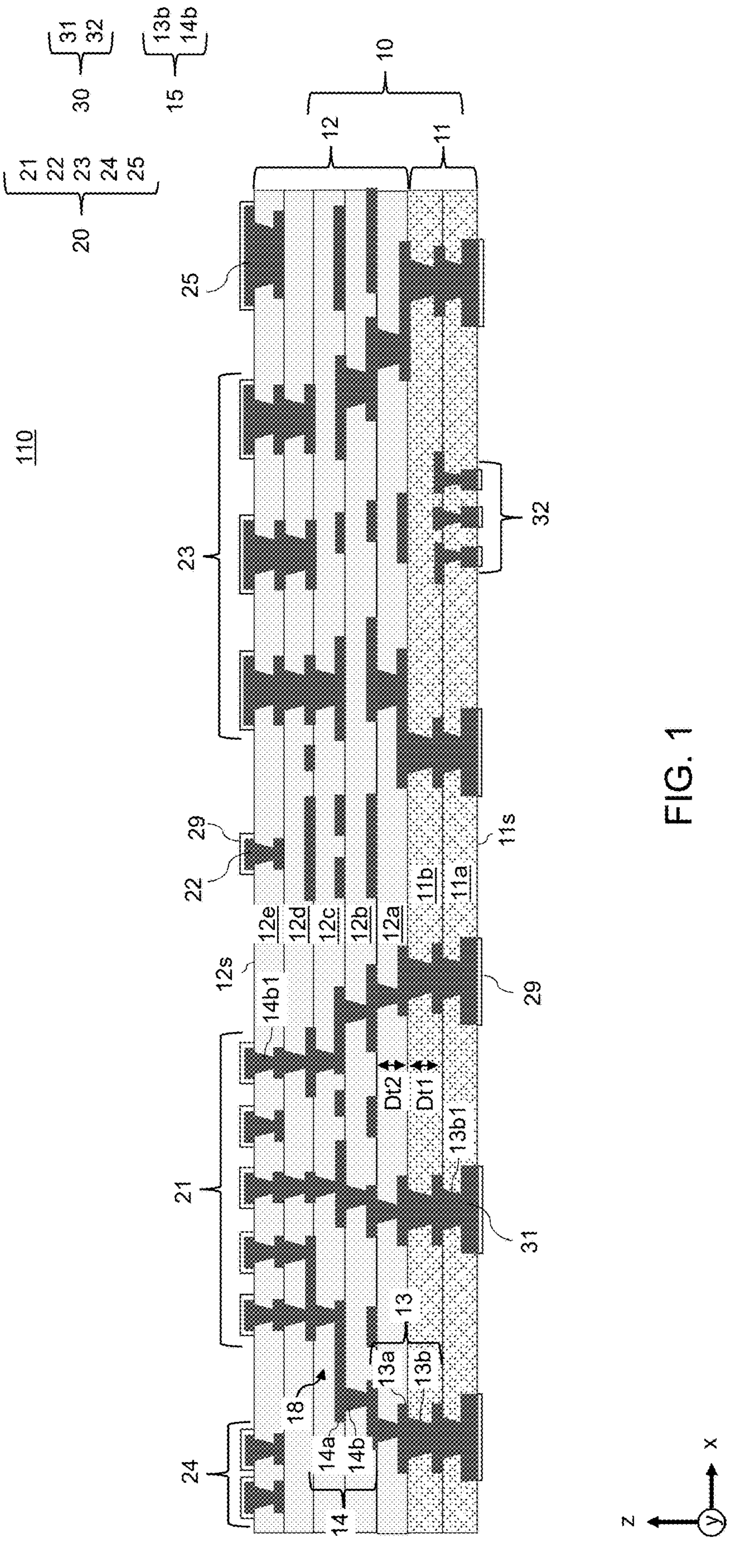
FIG. 1 is a vertical cross-sectional view of a package substrate according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Impedance mismatch and high inductance are two significant concerns associated with through-hole vias in the cores of package substrates in package structures. These issues can have detrimental effects on signal integrity, electrical performance, and the overall functionality of the package structure.

Impedance is a measure of the opposition a circuit presents to the flow of alternating current (AC). In the context of high-speed digital signals, maintaining a consistent characteristic impedance is desired for signal integrity. Any abrupt changes in impedance can lead to signal reflections, which result in signal degradation, data errors, and reduced overall performance. In instances in which high-speed signals pass through a through-hole via in the core of a package substrate, the abrupt transition from one layer to another can cause impedance mismatch. The change in the dielectric constant and thickness of the material around the via can disrupt the characteristic impedance of the signal path. The impedance mismatch may lead to signal reflections, ringing, and jitter, which can make it challenging to reliably transmit and receive data. This can be especially problematic in high-speed data communication, such as in modern microprocessors and memory interfaces.

Inductance is a property of electrical circuits that resists changes in current flow. In the context of vias, the via itself, as well as the loop formed by the trace connected to it, can exhibit a high inductance. This high inductance may limit the speed at which signals can switch and can also cause voltage drops. The high inductance can slow down the rise and fall times of signals, limiting maximum operating frequency and increasing power consumption. The high inductance may, therefore, lead to slower signal transitions which can be particularly problematic in high-speed applications where fast signal switching is required. Additionally, the increased power consumption due to high inductance can affect the overall efficiency of the package structure.

One or more embodiments of the present disclosure may include a package substrate that does not include a core with through-hole vias. The package substrate may, therefore, avoid the problems of impedance mismatch and high inductance to help ensure power integrity and signal integrity in the package substrate.

In at least one embodiment, the package substrate may include a dielectric layer structure including a first dielectric layer and a second dielectric layer, one or more bonding pads located at a lower surface of the first dielectric layer, one or more metal pillars located on an upper surface of the second dielectric layer, and a metal interconnect structure extending from the bonding pads to the metal pillars and including one or more vias in the first dielectric layer and the second dielectric layer. The vias may have a cross-sectional diameter that decreases in a direction from the second dielectric layer to the first dielectric layer. The package substrate may also include a solder resist layer on the lower surface of the first dielectric layer, in which case a surface of the bonding pads may be exposed through the solder resist layer.

In at least one embodiment the metal pillars may include one or more C4 metal bumps on the upper surface of the second dielectric layer, an upper surface-mounted device (SMD) pad adjacent the C4 metal bumps on the upper surface of the second dielectric layer, a metal dam adjacent the C4 metal bumps on the upper surface of the second dielectric layer, and a chip-scale package (CSP) pad adjacent the metal dam on the upper surface of the second dielectric layer. A diameter of the CSP pad may be greater than or equal to a diameter of the C4 metal bumps.

The metal pillars may further include an upper two-dimensional identification (2DID) pad adjacent the CSP pad on the upper surface of the second dielectric layer. The upper 2DID pad may include a two-dimensional array including one or more identification pads, and a diameter of the identification pads may be less than or equal to a diameter of the CSP pad.

In at least one embodiment, the bonding pads may include a lower two-dimensional identification (2DID) pad on the lower surface of the first dielectric layer. The lower 2DID pad may include a two-dimensional array including one or more identification pads, and a diameter of the identification pads may be less than or equal to a diameter of the CSP pad. The bonding pads may also include one or more ball grid array (BGA) bonding pads at the lower surface of the first dielectric layer, and a lower surface-mounted device (SMD) pad located at the lower surface of the first dielectric layer.

FIG. 1 is a vertical cross-sectional view of a package substrate 110 according to one or more embodiments. As illustrated in FIG. 1, the package substrate 110 may include a plurality of dielectric layers 10. The dielectric layers 10 may include one or more first dielectric layers 11 and one or more second dielectric layers 12 on the first dielectric layers 11. The first dielectric layers 11 may include first dielectric layer 11*a* (e.g., lowermost first dielectric layer 11*a*) and first dielectric layer 11*b* (e.g., uppermost first dielectric layer 11*b*). The second dielectric layers 12 may include second dielectric layer 12*a* (e.g., lowermost second dielectric layer 12*a*), second dielectric layer 12*b*, second dielectric layer 12*c*, second dielectric layer 12*d*, and second dielectric layer 12*e* (e.g., uppermost second dielectric layer 12*e*).

The dielectric layers 10 may include organic material (e.g., dielectric polymer) or inorganic material (e.g., silicon, ceramic material, glass, etc.). The organic material may include, for example, polyimide (PI), epoxy resin, acrylic resin, phenol resin, benzocyclobutene (BCB), polybenzoxazole (PBO), or any other suitable polymer-based dielectric material. Other dielectric materials are within the contemplated scope of disclosure. A thickness Dt1 of the first dielectric layers 11 and a thickness Dt2 of the second dielectric layers 12 may each be in a range from 10 μm to 70 μm (10 μm≤Dt1≤70 μm; 10 μm≤Dt2≤70 μm). In at least one embodiment, a total number of the dielectric layers 10 may be in a range from 2 to 10, but a greater number of the dielectric layers 10 is within the contemplated scope of disclosure.

In at least one embodiment the first dielectric layers 11 may be different than the second dielectric layers 12. In particular, the thickness Dt1 of the first dielectric layers 11 may be different than the thickness Dt2 of the second dielectric layers 12. A material of the first dielectric layers 11 may also be different than a material of the second dielectric layers 12. In at least one embodiment, a material of the first dielectric layers 11 may include an organic material (e.g., polymer) with re-enforcement material such as glass fiber or ceramics embedded therein (e.g., at least one of glass fibers or ceramic fibers embedded in an organic material matrix), and a material of the second dielectric layers 12 may include one or more of epoxy, Ajinomoto build-up film (ABF), or polyimide (PI). In at least one embodiment, to ensure sufficient rigidity of the package substrate 110, at least one of the first dielectric layers 11 or the second dielectric layers 12 may include an organic material (e.g., polymer) with re-enforcement material such as glass fiber or ceramics embedded therein.

In at least one embodiment the first dielectric layers 11 may be substantially the same as the second dielectric layers 12. In particular, the thickness Dt1 of the first dielectric layers 11 may be substantially the same as the thickness Dt2 of the second dielectric layers 12. A material of the first dielectric layers 11 may also be substantially the same as a material of the second dielectric layers 12. In at least one embodiment, a material of both the first dielectric layers 11 and the second dielectric layers 12 may include an organic material (e.g., polymer) with re-enforcement material such as glass fiber or ceramics embedded therein.

As illustrated in FIG. 1, the package substrate 110 may further include a metal interconnect structure 18 in the first dielectric layers 11 and the second dielectric layers 12. The metal interconnect structure 18 may extend from the lower surface 11*s* of the first dielectric layers 11 to the upper surface 12*s* of the second dielectric layers 12.

The metal interconnect structure 18 may include one or more first metal layers 13 in the first dielectric layers 11. The first metal layers 13 may include one or more metal layers including a metal, metal alloys, and/or other metal-containing compounds (e.g., Cu, Ag, Au, Al, Ni, Ti, W, Mo, Co, Ru, W, TiN, TaN, WN, etc.). Other suitable conductive materials (e.g., metals and non-metals) to be included in the first metal layers 13 are within the contemplated scope of disclosure.

The first metal layers 13 may include one or more first metal traces 13*a* located on an upper surface of the first dielectric layers 11. The first metal traces 13*a* may extend in the x-direction (first horizontal direction) and y-direction (second horizontal direction) on an upper surface of the first dielectric layers 11. In at least one embodiment, the first metal traces 13*a* may have a thickness in a range from 1 μm to 30 μm. However, greater and lesser thicknesses are within the contemplated scope of disclosure.

The first metal layers 13 may also include one or more first metal vias 13*b* connected to one or two of the first metal traces 13*a*. The first metal vias 13*b* may have a cross-sectional diameter that decreases in a direction from the second dielectric layers 12 to the first dielectric layers 11. Put another way, the diameter of the first metal vias 13*b* decreases from top to bottom.

The metal interconnect structure 18 may also include one or more second metal layers 14 in the second dielectric layers 12. The second metal layers 14 may also include one or more metal layers including a metal, metal alloys, and/or other metal-containing compounds (e.g., Cu, Ag, Au, Al, Ni, Ti, W, Mo, Co, Ru, W, TiN, TaN, WN, etc.). Other suitable conductive materials (e.g., metals and non-metals) to be included in the second metal layers 14 are within the contemplated scope of disclosure. In at least one embodiment, the material of the second metal layers 14 may be substantially the same as a material of the first metal layers 13. In at least one embodiment, the material of the second metal layers 14 may be different than the material of the first metal layers 13. For example, the first metal layers 13 may include copper and the second metal layers 14 may include silver.

The second metal layers 14 may include one or more second metal traces 14*a* located on an upper surface of the second dielectric layers 12. The second metal traces 14*a* may extend in the x-direction (first horizontal direction) and y-direction (second horizontal direction) on an upper surface 12*s* of the second dielectric layers 12.

In at least one embodiment, the second metal traces 14*a* may have a thickness in a range from 1 μm to 30 μm. However, greater and lesser thicknesses are within the contemplated scope of disclosure. In at least one embodiment, the thickness of the second metal traces 14*a* may be greater than or less than the thickness of the first metal traces 13*a*.

A total number of the first metal traces 13*a* and the second metal traces 14*a* may be in a range from 2 to 11. However, a greater total number of first metal traces 13*a* and the second metal traces 14*a* is within the contemplated scope of disclosure.

The second metal layers 14 may also include one or more second metal vias 14*b* connected to one or two of the second metal traces 14*a*. In at least one embodiment, the diameter of the second metal vias 14*b* may be greater than or less than a diameter of the first metal vias 13*b*. The second metal vias 14*b* together with the first meal vias 13*b* may constitute a plurality of metal vias 15 in the metal interconnect structure 18. The second metal vias 14*b* may also have a cross-sectional diameter that decreases in a direction from the second dielectric layers 12 to the first dielectric layers 11. Put another way, the diameter of the second metal vias 14*b* may decrease from top to bottom. In at least one embodiment, each of the first metal vias 13*b* and each of the second metal vias 14*b* may have a cross-sectional diameter that decreases in a direction from the second dielectric layers 12 to the first dielectric layers 11.

The first metal layers 13 and second metal layers 14 of the metal interconnect structure 18 may include metallic connection structures, i.e., metallic structures that provide electrical connection between nodes in the package substrate 110. The first metal layers 13 and second metal layers 14 may each include a metallic seed layer and a metallic fill material on the metallic seed layer. In at least one embodiment, the metallic seed layer may include a stack of a titanium barrier layer and a copper seed layer. Other suitable metallic seed materials are within the contemplated scope of disclosure. The titanium barrier layer may have a thickness in a range from 50 nm to 500 nm, and the copper seed layer may have a thickness in a range from 50 nm to 500 nm. In at least one embodiment, the metallic fill material for the first metal layers 13 and second metal layers 14 may include copper, nickel, or copper and nickel. Other suitable metallic fill materials are within the contemplated scope of disclosure.

As further illustrated in FIG. 1, the first metal vias 13*b* in the metal interconnect structure 18 may include one or more lowermost first metal vias 13*b*1. The second metal vias 14*b* in the metal interconnect structure 18 may include one or more uppermost second metal vias 14*b*1.

The package structure 110 may further include one or more metal pillars 20 on the upper surface 12*s* of the second dielectric layers 12. The metal pillars 20 may contact an upper surface of the uppermost second metal vias 14*b*1. A shape of the metal pillars 20 in the plan view (e.g., top down view) may include a circular shape, a square shape, an oval shape, a rectangular shape, etc. Other horizontal cross-sectional shapes are within the contemplated scope of disclosure.

The metal pillars 20 may include one or more metals such as copper, silver, gold, aluminum, nickel, titanium, or a combination thereof. Other suitable conductive materials (e.g., metals and non-metals) to be included in the metal pillars 20 are within the contemplated scope of disclosure. In at least one embodiment, the material of the metal pillars 20 may be substantially the same as a material of the uppermost second metal vias 14*b*1. In at least one embodiment, the material of the metal pillars 20 may be different than the material of the uppermost second metal vias 14*b*1.

The metal pillars 20 may include, for example, one or more C4 metal bumps 21, a metal dam 22 adjacent the C4 metal bumps 21, one or more chip-scale package (CSP) pads 23 adjacent the metal dam 22, one or more upper surface-mounted device (SMD) pads 24 adjacent the C4 metal bumps 21, and an upper two-dimensional identification (2DID) pad 25 adjacent the CSP pads 23. The upper 2DID pad may include a single pad or a plurality of separate identification pads.

In at least one embodiment, the C4 metal bumps 21, the metal dam 22 and the CSP pads 23 may have a circular shape in a plan view. In at least one embodiment, the upper SMD pads 24 and the upper 2DID pad 25 may have a square or rectangular shape in the plan view. Other horizontal cross-sectional shapes are within the contemplated scope of disclosure.

A material of the C4 metal bumps 21, a material of the metal dam 22, material of the CSP pads 23, a material of the upper SMD pads 24 and a material of the upper 2DID pads 25 may be the same or different. Thus, for example, a material of the upper SMD pads 24 may include copper and a material of the C4 metal bumps 21 may include aluminum, a material of both the C4 metal bumps 21 and the CSP pads 23 may include silver, and so on.

A height of the C4 metal bumps 21, height of the metal dam 22, height of the CSP pads 23, height of the upper SMD pads 24 and height of the upper 2DID pads 25 may be the same or different. Thus, for example, a height of the upper SMD pads 24 may be less than a height of the C4 metal bumps 21, a height of the C4 metal bumps 21 may be less than a height of the CSP pads 23, and so on.

A diameter of the C4 metal bumps 21, diameter of the metal dam 22, diameter of the CSP pads 23, width (in the x-direction) and length (in the y-direction) of the upper SMD pads 24 and width and length of the upper 2DID pads 25 may be the same or different. Thus, for example, a width of the upper SMD pads 24 may be less than a diameter of the C4 metal bumps 21, a diameter of the C4 metal bumps 21 may be less than a diameter of the CSP pads 23, and so on.

The package structure 110 may also include one or more bonding pads 30 on the lower surface 11*s* of the first dielectric layers 11. The bonding pads 30 may include a lower surface that is substantially coplanar with the lower surface 11*s* of the first dielectric layers 11. In at least one embodiment, the lower surface of the bonding pads 30 may not extend in the z-direction beyond the lower surface 11*s* of the first dielectric layers 11. That is, in at least one embodiment, an entirety of the bonding pads 30 (except for the lower surface) may be embedded in the first dielectric layer 11*a*.

The bonding pads 30 may contact a lower surface of the lowermost first metal vias 13*b*1. The bonding pads 30 may include, for example, one or more ball grid array (BGA) bonding pads 31 and one or more lower surface-mounted device (SMD) pads 32 located at the lower surface of the first dielectric layer. In at least one embodiment, the BGA bonding pads 31 and the lower SMD pads 32 may have a circular shape in a plan view (e.g., bottom-up view). Other horizontal cross-sectional shapes are within the contemplated scope of disclosure. The metal interconnect structure 18 may electrically connect the BGA bonding pads 31 and the lower SMD pads 32 to the metal pillars 30. In particular, the metal interconnect structure 18 may electrically connect the bonding pads 31 to the C4 bumps 21, connect the BGA bonding pads 31 to the upper surface-mounted device (SMD) pads 24, connect the lower SMD pads 32 to the C4 bumps 21, etc.

The bonding pads 30 may include one or more metals such as copper, silver, gold, aluminum, nickel, titanium, or a combination thereof. Other suitable conductive materials (e.g., metals and non-metals) may be included in the bonding pads 30 within the contemplated scope of disclosure. A material of the bonding pads 30 may be substantially the same as the material of the metal pillars 20. In at least one embodiment, the material of the metal pillars 20 may be substantially the same as a material of the uppermost second metal vias 14*b*1. In at least one embodiment, the material of the metal pillars 20 may be different than the material of the uppermost second metal vias 14*b*1.

A material of the BGA bonding pads 31 and a material of the lower SMD pads 32 may be the same or different. In at least one embodiment, the BGA bonding pads 31 and the lower SMD pads 32 are formed of the same layer, in which case a height of the BGA bonding pads 31 may be substantially the same as a height of the lower SMD pads 32.

However, in at least one embodiment, a height of the BGA bonding pads 31 may be different than a height of the lower SMD pads 32. A diameter of the BGA bonding pads 31 may be the same or different than a diameter of the lower SMD pads 32. In at least one embodiment, the diameter of the BGA bonding pads 31 may be substantially greater than the diameter of the lower SMD pads 32 (e.g., at least twice the diameter of the lower SMD pads 32.

As further illustrated in FIG. 1, the package substrate 110 may include a surface coating 29 (e.g., surface finish). The surface coating 29 may be located on all exposed metal surfaces in the package substrate 110. The surface coating 29 may be located on an upper surface and a side surface of the metal pillars 20. The surface coating 29 may also be located on the lower surface of the bonding pads 30 which are exposed at the lower surface 11*s* of the first dielectric layers 11. The surface coating 29 may include one or more protective layers that inhibit oxidation of the metal pillars 20 and the bonding pads 30. A material of the surface coating 29 on the metal pillars 20 may be the same or different than a material of the surface coating 29 on the bonding pads 30.

The surface coating 29 may have a total thickness in a range from 0.5 μm to 10 μm. The surface coating 29 may include one or more different materials. In at least one embodiment, the surface coating 29 may include an electroless nickel/electroless palladium/immersion gold (ENEPIG) coating (e.g., a stack including a nickel layer (e.g., about 3 μm to 6 μm), palladium layer (e.g., about 0.05 μm to 0.15 μm) and gold layer (e.g., about 0.03 μm or more) in that order). In at least one embodiment, the surface coating 29 may include an immersion gold/electroless palladium/immersion gold (IGEPIG) coating. (e.g., a stack including a gold layer, palladium layer and gold layer in that order). In at least one embodiment, the surface coating 29 may include an immersion tin coating.

It should be noted that a height (in the z-direction) of an upper surface of the metal pillars 20 may be greater than a height of the upper surface 12*s* of the uppermost second dielectric layer 12*e*. In at least one embodiment, the height of the upper surface of the metal pillars 20 may be greater than a height of any layer (e.g., solder resist layer) formed on the upper surface 12*s*. In at least one embodiment, an entirety of the upper surface 12*s* may be exposed except for the metal pillars 20 and the surface coating 29. In at least one embodiment, there may be no layer or structure (e.g., solder resist layer) on the upper surface 12*s* other than the metal pillars 20 and the surface coating 29.

FIG. 2A is a vertical cross-sectional view of the C4 metal bumps 21 according to one or more embodiments. As illustrated in FIG. 2A, the C4 metal bumps 21 may contact the upper surface of the uppermost second metal vias 14*b*1 (indicated by the dashed line in FIG. 2A) at the upper surface 12*s* of the second dielectric layers 12.

The C4 metal bumps 21 may have an C4 metal bump height Bh in a range from 2 μm to 25 μm. The C4 metal bumps 21 may have an C4 metal bump width/diameter Bd in a range from 20 μm to 100 μm. The C4 metal bumps 21 may have an C4 metal bump pitch Bp in a range from 55 μm to 200 μm. Other dimensional values of the C4 metal bumps 21 are within the contemplated scope of disclosure.

The uppermost second metal vias 14*b*1 on which the C4 metal bumps 21 are located may have a top diameter Vt in a range from 10 μm to 75 μm and a bottom diameter Vb in a range from 1 μm to 75 μm. The bottom diameter Vb may be less than or equal to the top diameter Vt. In at least one embodiment, the bottom diameter Vb may be substantially less than the top diameter Vt (e.g., less than 80% of the top diameter Vt).

FIG. 2B is a vertical cross-sectional view of the CSP pads 23 according to one or more embodiments. As illustrated in FIG. 2B, the CSP pads 23 may contact the upper surface of the uppermost second metal vias 14*b*1 (indicated by the dashed line in FIG. 2B) at the upper surface 12*s* of the second dielectric layers 12.

The CSP pads 23 may have an CSP pad height Ph in a range from 2 μm to 30 μm. The CSP pads 23 may have an CSP pad diameter Pd in a range from 100 μm to 750 μm. The CSP pads 23 may have an CSP pad pitch Pp in a range from 150 μm to 1500 μm. Other dimensional values of the CSP pads 23 are within the contemplated scope of disclosure.

The uppermost second metal vias 14*b*1 on which the CSP pads 23 are located may have a top diameter PVt in a range from 10 μm to 1200 μm and a bottom diameter PVb in a range from 1 μm to 1200 μm. The bottom diameter PVb may be less than or equal to the top diameter PVt. In at least one embodiment, the bottom diameter PVb may be substantially less than the top diameter PVt (e.g., less than 80% of the top diameter PVt).

FIG. 2C is a vertical cross-sectional view of the metal dam 22 according to one or more embodiments. As illustrated in FIG. 2C, the metal dam 22 may contact the upper surface of the uppermost second metal vias 14*b*1 at the upper surface 12*s* of the second dielectric layers 12.

The metal dam 22 may have a metal dam height Dh in a range from 2 μm to 30 μm. The metal dam 22 may have a metal dam diameter Dw in a range from 20 μm to 250 μm. Other dimensional values of the metal dam 22 are within the contemplated scope of disclosure.

The uppermost second metal via 14*b*1 on which the metal dam 22 is located may have a top diameter DVt in a range from 10 μm to 200 μm and a bottom diameter DVb in a range from 1 μm to 200 μm. The bottom diameter DVb may be less than or equal to the top diameter DVt. In at least one embodiment, the bottom diameter DVb may be substantially less than the top diameter DVt (e.g., less than 80% of the top diameter DVt).

Figure 2D:
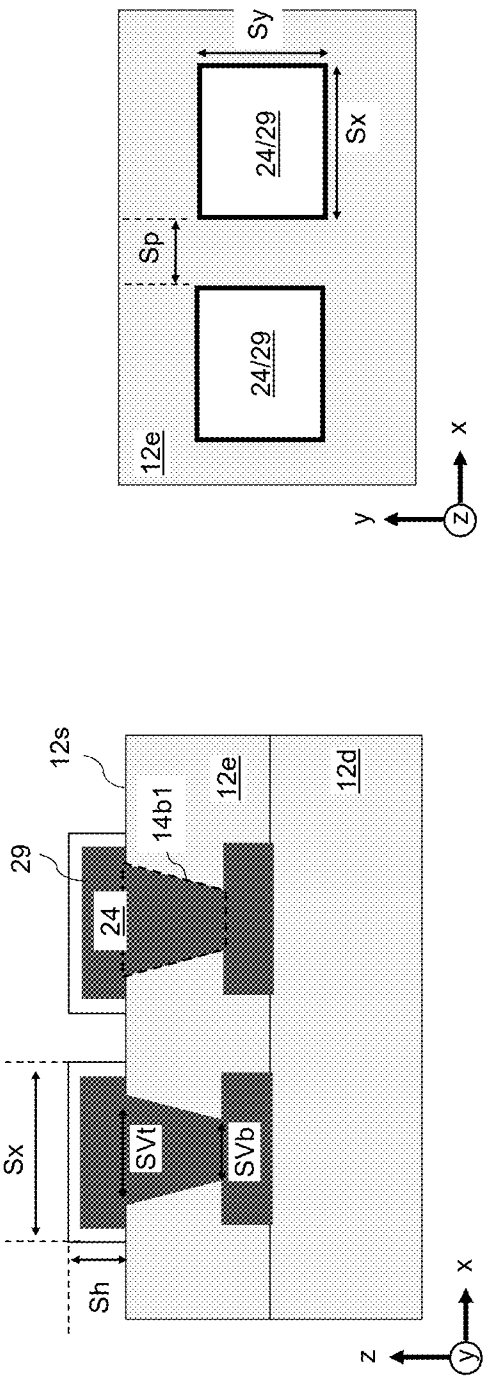
FIG. 2D is a vertical cross-sectional view of the upper SMD pads (the left side of FIG. 2D) and a plan view (top down view) of the upper SMD pads (right side of FIG. 2D) according to one or more embodiments.

FIG. 2D is a vertical cross-sectional view of the upper SMD pads 24 (the left side of FIG. 2D) and a plan view (top down view) of the upper SMD pads 24 (right side of FIG. 2D) according to one or more embodiments. As illustrated in FIG. 2D, the upper SMD pads 24 may contact the upper surface of the uppermost second metal vias 14*b*1 (indicated by the dashed line in FIG. 2B) at the upper surface 12*s* of the second dielectric layers 12.

The upper SMD pads 24 may have an upper SMD pad height Sh in a range from 2 μm to 30 μm. The upper SMD pads 24 may have an upper SMD pad x-dimension Sx in a range from 20 μm to 10000 μm. The upper SMD pads 24 may also have an upper SMD pad y-dimension Sy in a range from 20 μm to 10000 μm. The upper SMD pads 24 may have an upper SMD pad to pad distance Sp in a range from 10 μm to 10000 μm. Other dimensional values of the upper SMD pads 24 are within the contemplated scope of disclosure.

The uppermost second metal vias 14*b*1 on which the upper SMD pads 24 are located may have a top diameter SVt in a range from 10 μm to 200 μm and a bottom diameter SVb in a range from 1 μm to 200 μm. The bottom diameter SVb may be less than or equal to the top diameter SVt. In at least one embodiment, the bottom diameter SVb may be substantially less than the top diameter SVt (e.g., less than 80% of the top diameter PVt).

Figure 2E:
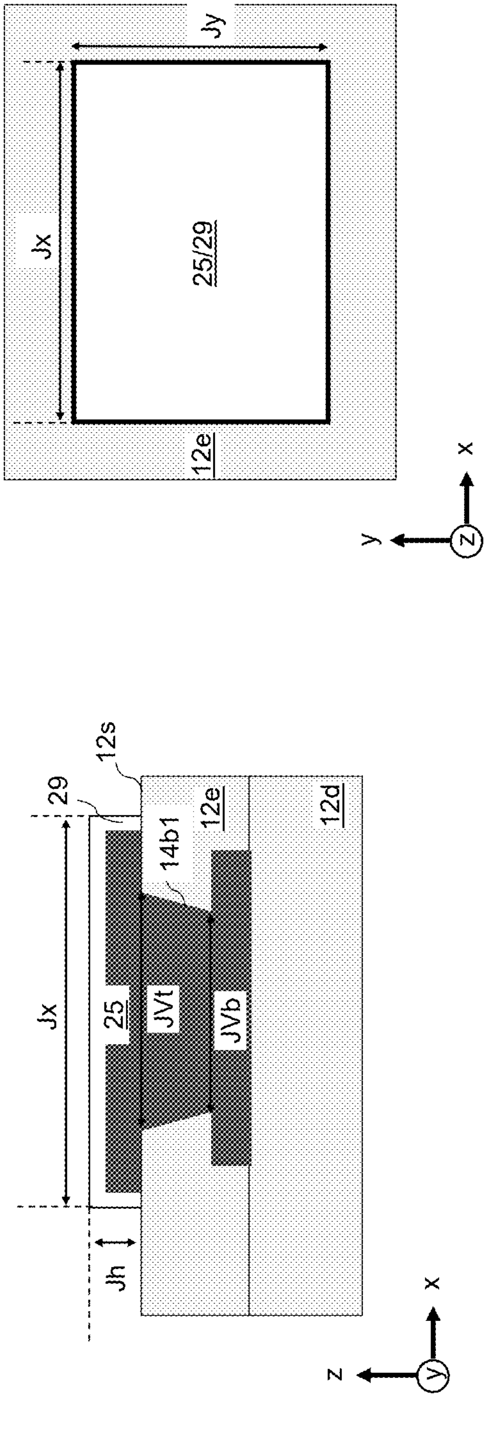
FIG. 2E is a vertical cross-sectional view of the upper 2DID pad (the left side of FIG. 2DE) and a plan view (top down view) of the upper 2DID pad (right side of FIG. 2E) according to one or more embodiments.

FIG. 2E is a vertical cross-sectional view of the upper 2DID pad 25 (the left side of FIG. 2DE) and a plan view (top down view) of the upper 2DID pad 25 (right side of FIG. 2E) according to one or more embodiments. As illustrated in FIG. 2E, the upper 2DID pad 25 may contact the upper surface of the uppermost second metal vias **14*b*1 at the upper surface 12*s* of the second dielectric layers 12**.

The upper 2DID pad 25 may have a 2DID pad height Dh in a range from 2 μm to 30 μm. The upper 2DID pad 25 may have a 2DID pad x-dimension Jx in a range from 20 μm to 3000 μm and an upper 2DID pad y-dimension Jy in a range from 20 μm to 3000 μm. Other dimensional values of the upper 2DID pad 25 are within the contemplated scope of disclosure.

The uppermost second metal via **14*b*1 on which the upper 2DID pad 25 is located may have a top diameter JVt in a range from 10 μm to 200 μm and a bottom diameter JVb in a range from 1 μm to 200 μm. The bottom diameter JVb may be less than or equal to the top diameter JVt. In at least one embodiment, the bottom diameter JVb may be substantially less than the top diameter JVt (e.g., less than 80% of the top diameter JVt). Further, it should be noted that there can be more than one uppermost second metal via 14*b*1 supporting the upper 2DID pad 25**.

FIG. 2F is a vertical cross-sectional view of the BGA bonding pads 31 according to one or more embodiments. As illustrated in FIG. 2F, the lower surface of the lowermost first metal vias **13*b*1 (indicated by the dashed line in FIG. 2F) may contact an upper surface of the BGA bonding pads 31 within the first dielectric layers 11**.

The BGA bonding pads 31 may have an BGA bonding pad height Bho in a range from 0 μm to 30 μm. The BGA bonding pads 31 may have an BGA bonding pad thickness Bhi in a range from 0 μm to 30 μm. The BGA bonding pads 31 may have an BGA bonding pad diameter Bd in a range from 100 μm to 1000 μm. The BGA bonding pads 31 may have an BGA bonding pad pitch Bp in a range from 120 μm to 1500 μm. Other dimensional values of the BGA bonding pads 31 are within the contemplated scope of disclosure.

The lowermost first metal vias **13*b*1 that contact the upper surface of the BGA bonding pads 31** may have a top diameter BVt in a range from 10 μm to 200 μm and a bottom diameter BVb in a range from 1 μm to 200 μm. The bottom diameter BVb may be less than or equal to the top diameter BVt. In at least one embodiment, the bottom diameter BVb may be substantially less than the top diameter BVt (e.g., less than 80% of the top diameter BVt).

FIG. 2G is a vertical cross-sectional view of the lower SMD pads 32 according to one or more embodiments. As illustrated in FIG. 2G, the lower surface of the lowermost first metal vias **13*b*1 (indicated by the dashed line in FIG. 2G) may contact an upper surface of the lower SMD pads 32 within the first dielectric layers 11**.

The lower SMD pads 32 may have a lower SMD pad height Mho in a range from 0 μm to 30 μm. The lower SMD pads 32 may have a lower SMD pad thickness Mhi in a range from 0 μm to 30 μm. The lower SMD pads 32 may have a lower SMD pad diameter Md in a range from 20 μm to 3000 μm. The lower SMD pads 32 may have a lower SMD pad pitch Mp in a range from 30 μm to 3500 μm. Other dimensional values of the lower SMD pads 32 are within the contemplated scope of disclosure.

The lowermost first metal vias **13*b*1 that contact the upper surface of the lower SMD pads 32** may have a top diameter MVt in a range from 10 μm to 200 μm and a bottom diameter MVb in a range from 1 μm to 200 μm. The bottom diameter MVb may be less than or equal to the top diameter MVt. In at least one embodiment, the bottom diameter MVb may be substantially less than the top diameter MVt (e.g., less than 80% of the top diameter MVt).

Figure 3A:
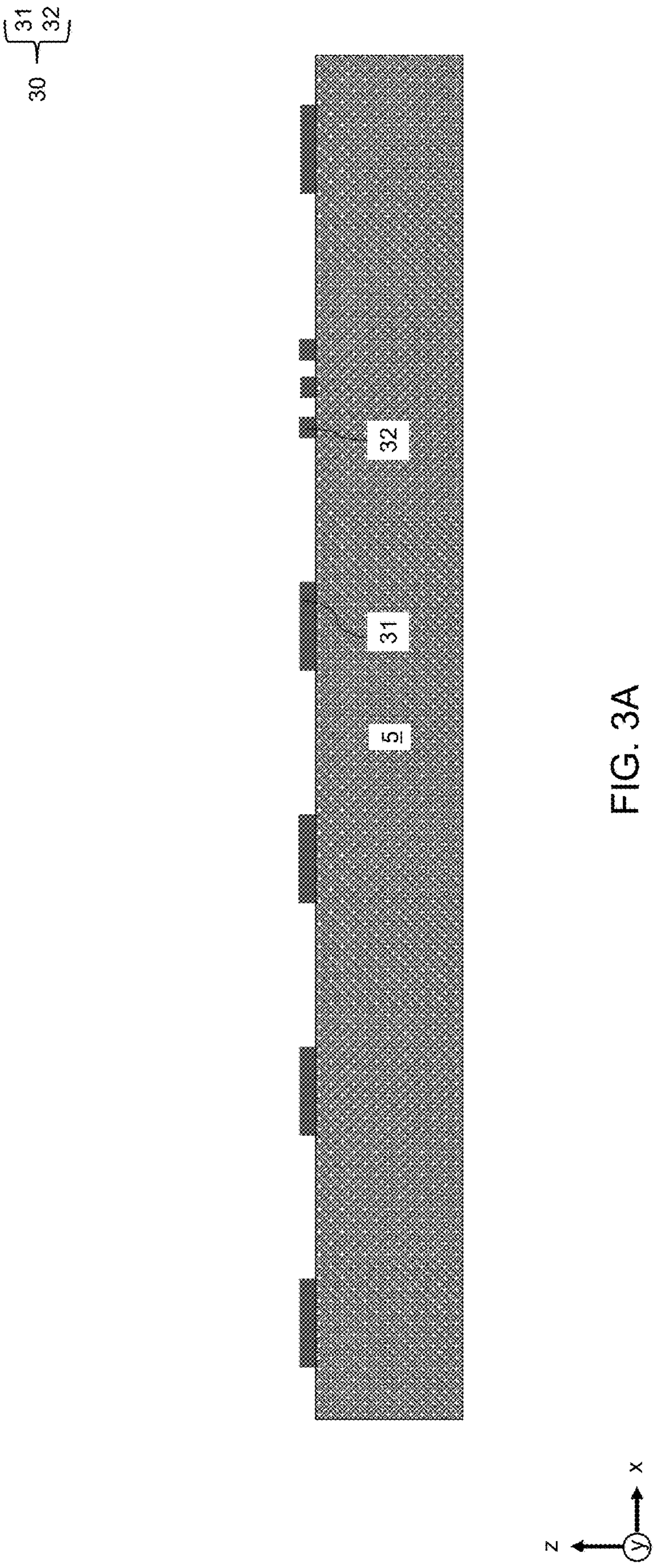
FIG. 3A is a vertical cross-sectional view of an intermediate structure including the bonding pads (e.g., BGA bonding pads and lower SMD pads) formed on a carrier substrate (e.g., carrier wafer) according to an embodiment of the present invention.

FIGS. 3A-3G illustrate various intermediate structures in a method of forming the package substrate 110 according to one or more embodiments. FIG. 3A is a vertical cross-sectional view of an intermediate structure including the bonding pads 30 (e.g., BGA bonding pads 31 and lower SMD pads 32) formed on a carrier substrate 5 (e.g., carrier wafer) according to an embodiment of the present invention. The carrier substrate 5 may be a circular wafer or a rectangular wafer. The lateral dimensions (such as the diameter of a circular wafer or a side of a rectangular wafer) of the carrier substrate 5 may be in a range from 100 mm to 500 mm, such as from 200 mm to 400 mm, although lesser and greater lateral dimensions may also be used. The carrier substrate 5 may include a semiconductor substrate, an insulating substrate, or a conductive substrate. The carrier substrate 5 may be transparent or opaque. The thickness of the carrier substrate 5 may be sufficient to provide mechanical support to an array of interposers to be formed thereupon. For example, the thickness of the carrier substrate 5 may be in a range from 60 microns to 1 mm, although lesser and greater thicknesses may also be used.

An adhesive layer (not shown) may be applied to the top surface of the carrier substrate 5. In one embodiment, the carrier substrate 5 may include an optically transparent material such as glass or sapphire. In this embodiment, the adhesive layer may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer may include a thermally decomposing adhesive material. For example, the adhesive layer may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

The bonding pads 30 may be formed on the adhesive layer. The bonding pads 30 may be formed by depositing (e.g., by CVD, PVD or other suitable deposition technique) one or more metal layers including a metal, metal alloys, and/or other metal-containing compounds (e.g., Cu, Ag, Au, Al, Ni, Ti, W, Mo, Co, Ru, W, TiN, TaN, WN, etc.). The metal layer(s) may then be patterned by a photolithographic process so as to form the bonding pads 30. The photolithographic process may include forming a patterned photoresist mask (not shown) on a layer of the metallic material, and etching (e.g., wet etching, dry etching, etc.) the exposed upper surface of the layer of metallic material through openings in the photoresist mask. The photoresist mask may be subsequently removed by ashing, dissolving the photoresist mask or by consuming the photoresist mask during the etch process.

In at least one embodiment, the bonding pads 30 may include an underbump metallurgy (UBM) layer stack (not shown) deposited over the adhesive layer. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used. A photoresist layer may be applied over the UBM layer stack, and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack may form the bonding pads 30.

Figure 3B:
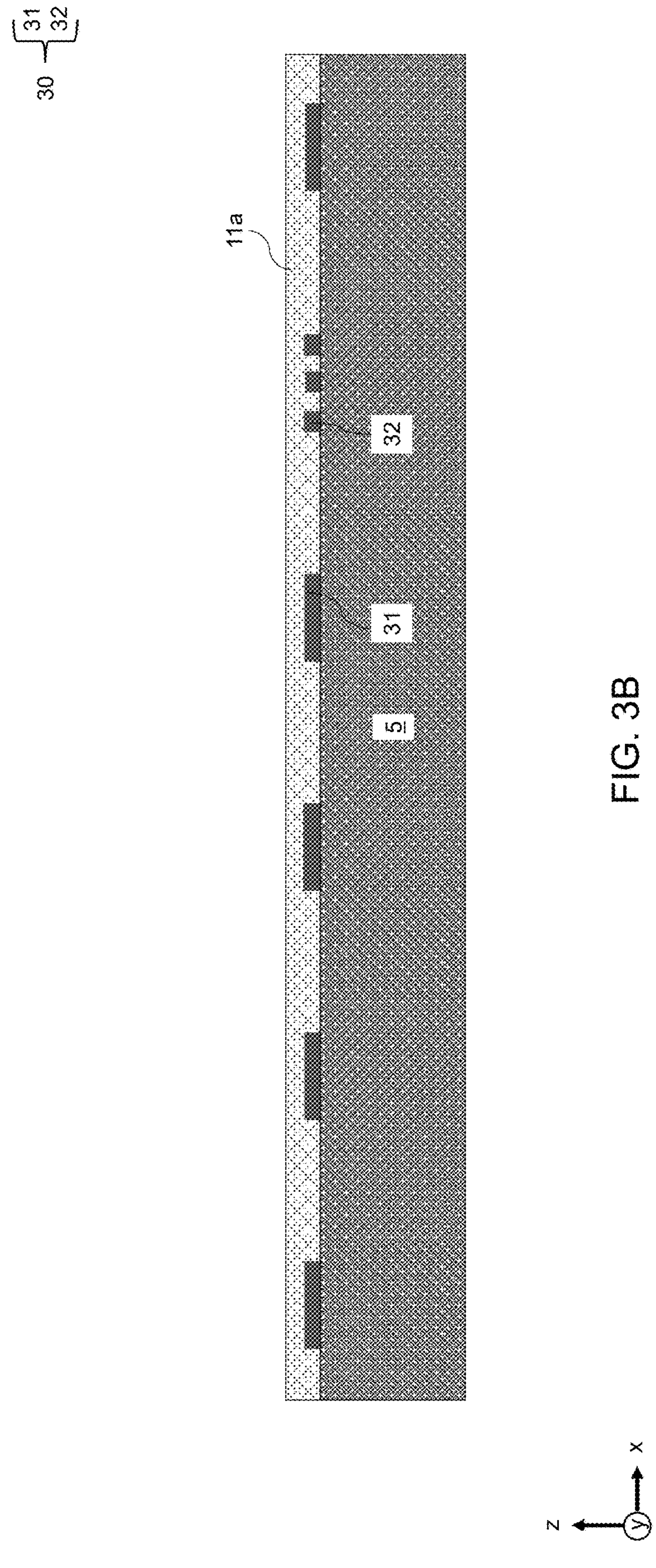
FIG. 3B is a vertical cross-sectional view of an intermediate structure including the first dielectric layer according to an embodiment of the present invention.

FIG. 3B is a vertical cross-sectional view of an intermediate structure including the first dielectric layer 11*a* according to an embodiment of the present invention. The first dielectric layer 11*a* may be formed, for example, by depositing (e.g., by CVD, PVD or other suitable deposition technique) a layer of dielectric material (e.g., an organic material (e.g., polymer) with re-enforcement material such as glass fiber or ceramics embedded therein) on the bonding pads 30 and on the carrier substrate 5.

Figure 3C:
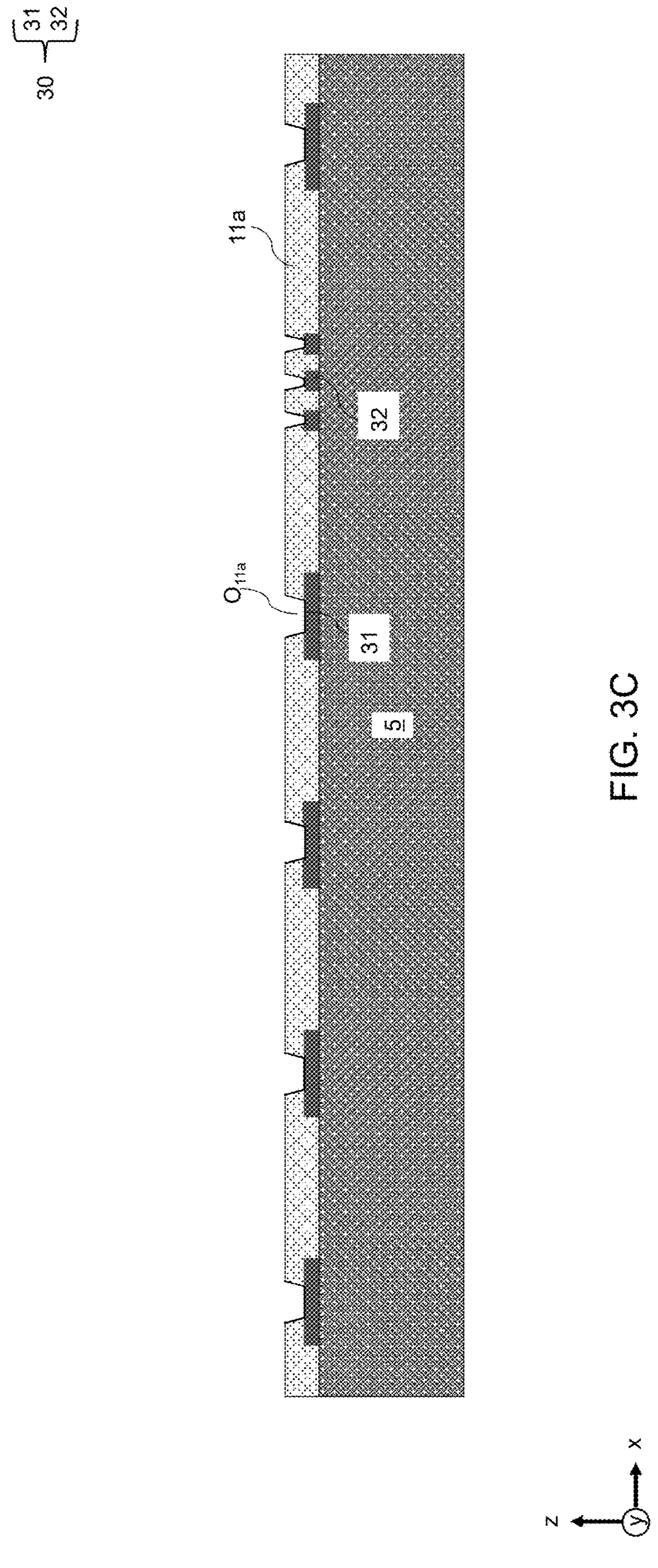
FIG. 3C is a vertical cross-sectional view of an intermediate structure including openings in the first dielectric layer according to an embodiment of the present invention.

FIG. 3C is a vertical cross-sectional view of an intermediate structure including openings Olla in the first dielectric layer 11*a* according to an embodiment of the present invention. The openings Olla may be formed as a pattern in the first dielectric layer 11*a* may by a photolithographic process. The photolithographic process may include forming a patterned photoresist mask (not shown) on the layer of dielectric material, and etching (e.g., wet etching, dry etching, etc.) the exposed upper surface of the dielectric material through openings in the photoresist mask. The photoresist mask may be subsequently removed by ashing, dissolving the photoresist mask or by consuming the photoresist mask during the etch process.

FIG. 3D is a vertical cross-sectional view of an intermediate structure including first metal traces 13*a* and the lowermost first metal vias 13*b*1 according to an embodiment of the present invention. The first metal traces 13*a* and the lowermost first metal vias 13*b*1 may be formed concurrently, for example, by depositing (e.g., by CVD, PVD or other suitable deposition technique) one or more layers of metal material such as copper, silver, gold, aluminum, nickel, titanium, a combination thereof or other suitable metals, on the first dielectric layer 11*a* and in the openings Olla formed in the first dielectric layer 11*a*. The layer(s) of metal material may fill the openings Olla so as to form the lowermost first metal via 13*b*1. The layer(s) of metal material may also deposit on an upper surface of the first dielectric layer 11*a*.

The metal material on the upper surface of the first dielectric layer 11*a* may then be patterned by a photolithographic process to form the metal trace 13*a* on the upper surface of the first dielectric layer 11*a*. The photolithographic process may include forming a patterned photoresist mask (not shown) on the layer of metal material, and etching (e.g., wet etching, dry etching, etc.) the exposed upper surface of the metal material through openings in the photoresist mask. The photoresist mask may be subsequently removed by ashing, dissolving the photoresist mask or by consuming the photoresist mask during the etch process.

The first dielectric layer 11*b* may then be formed on the first dielectric layer 11*a* and the metal traces 13*a* on the upper surface of the first dielectric layer 11*a*. The first dielectric layer 11*b* may then be patterned as described above with respect to FIG. 3C. Another layer of metal material may then be formed in the openings in the first dielectric layer 11*b* to form the first metal vias 13*b* in the first dielectric layer 11*b*. The metal material on the surface of the first dielectric layer 11*b* may then be patterned (e.g., by the photolithographic process described above) to form the metal traces 13*a* on the first dielectric layer 11*b*.

Figure 3E:
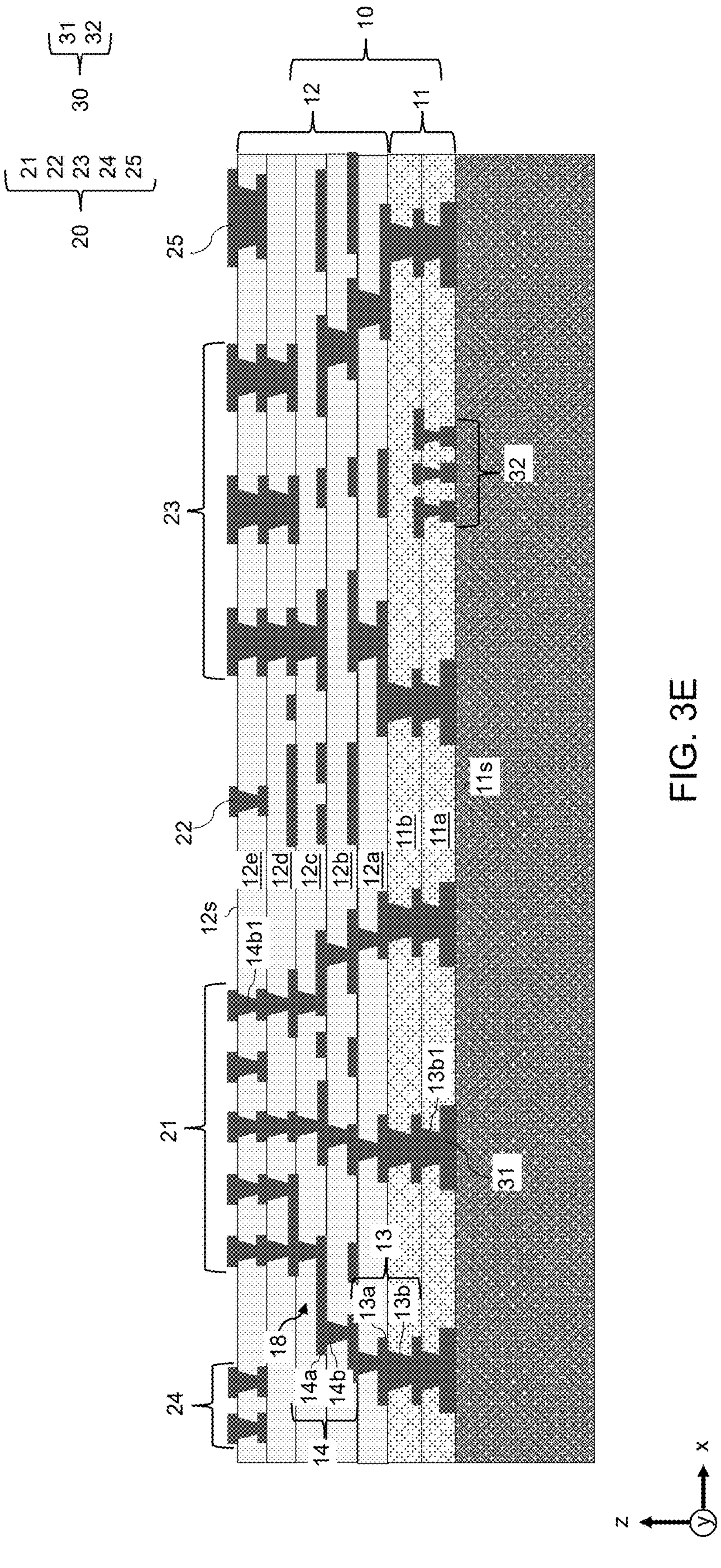
FIG. 3E is a vertical cross-sectional view of an intermediate structure including the second dielectric layers and metal interconnect structure according to an embodiment of the present invention.

FIG. 3E is a vertical cross-sectional view of an intermediate structure including the second dielectric layers 12 and metal interconnect structure 18 according to an embodiment of the present invention. The second dielectric layers 12 may be formed on the first dielectric layers 11 by a process similar to the process of forming the first dielectric layers 11 described above. The material deposited to form the second dielectric layers 12 may be the same or different than the material deposited to form the first dielectric layers 11. In at least one embodiment, the material deposited to form the second dielectric layers 12 may include one or more of epoxy, Ajinomoto build-up film (ABF), or polyimide (PI). The second metal traces 14*a* and second metal vias 14*b* may also be formed (alternately with second dielectric layers 12) by a process similar to the process of forming the first metal traces 13*a* and first metal vias 13*b* described above.

After the second dielectric layer 12*e* is deposited, it may be patterned (e.g., by a photolithographic process described above to form openings in the second dielectric layer 12*e*. A layer of metal material may then be formed by a suitable deposition process such as CVD, PVD, etc. in the openings to form the uppermost second metal via 14*b*1 in the second dielectric layer 12*e*. In the same process, the layer of metal material may also be formed on the upper surface 12*s* of the second dielectric layers 12 (e.g., the upper surface of the second dielectric layer 12*e*).

The layer of metal material should be formed (e.g., deposited) to have a thickness equal to a greatest desired height from among the desired heights of the metal pillars 20 (e.g., C4 metal bump height, metal dam height, CSP pad height, upper SMD pad height, and upper 2DID pad height). Thus, for example, in instances in which the desired height of the C4 metal bumps 21 is 25 μm but the desired height of each the metal dam 22, CSP pad 23, upper SMD pad 24, and upper 2DID pad 25 is 20 μm, then the layer of metal material should be formed to have a thickness of 25 μm The layer of metal material may then be patterned by a photolithographic process to form the metal pillars 20 on the upper surface of the second dielectric layer 12.

One or more additional photolithographic processes may be performed to adjust a height of one or more of the metal pillars 20. Thus, using the example in the preceding paragraph, the photolithographic process may be used to reduce the height of each the metal dam 22, CSP pad 23, upper SMD pad 24, and upper 2DID pad 25 to the desired height of 20 μm, while maintaining the height of the C4 metal bumps 21 at 25 μm.

Figure 3F:
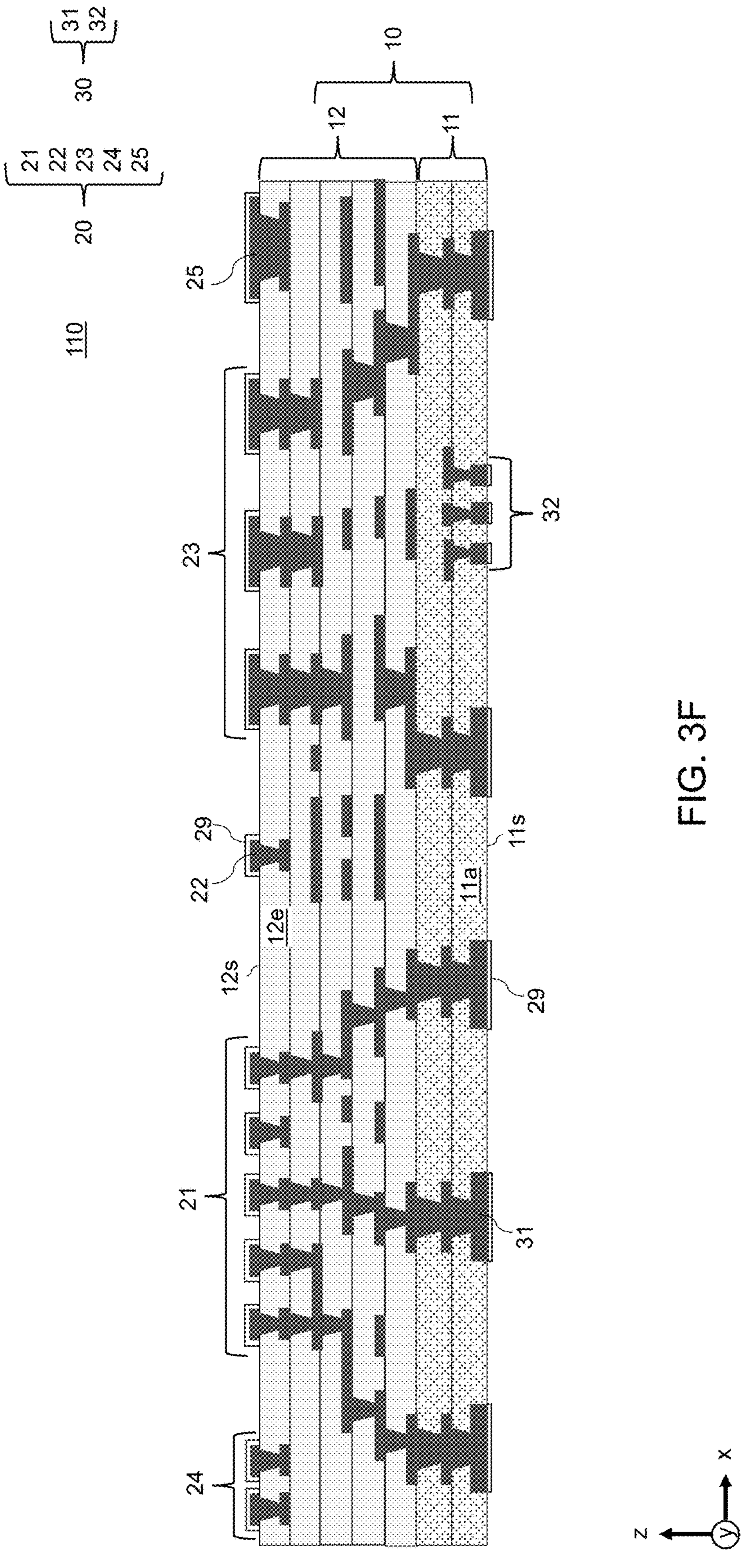
FIG. 3F is a vertical cross-sectional view of an intermediate structure including the surface coating according to an embodiment of the present invention.

FIG. 3F is a vertical cross-sectional view of an intermediate structure including the surface coating 29 according to an embodiment of the present invention. As illustrated in FIG. 3F, after the metal pillars 20 are formed, the package substrate 110 may be removed from the carrier substrate 5 (see FIG. 3E). The carrier substrate 5 may be detached from the package substrate 110, for example, by deactivating the adhesive layer (not shown) adhering the carrier substrate 5 to the package substrate 110. The adhesive layer may be deactivated, for example, by a thermal anneal at an elevated temperature (e.g., for a thermally-deactivated adhesive material, or by exposing the adhesive layer to ultraviolet light (e.g., for an ultraviolet-deactivated adhesive material).

The surface coating 29 may include a plurality of layers and each of the plurality of layers may be applied in a separate process. The surface coating 29 may be applied concurrently to the metal pillars 20 and the bonding pads 30. The surface coating 29 may alternatively or additionally be applied in a plurality of separate processes to the metal pillars 20 and the bonding pads 30.

The process for applying the surface coating 29 may include one or more plating processes (e.g., electroless plating processes). The process may also include or more immersion processes in which the package substrate 110 is dipped into a bath of solution containing a metal salt which reacts (in a displacement reaction) with the material (e.g., copper) of the metal pillars 20 and bonding layers 30. The metal salt may include a tin salt (e.g., stannous sulfate, stannous fluoborate, or stannous chloride) to form a tin layer as part of the surface coating 29, a silver salt (e.g., silver cyanide or silver sulfamate) to form a silver layer as part of the surface coating 29, and so on.

Figure 4:
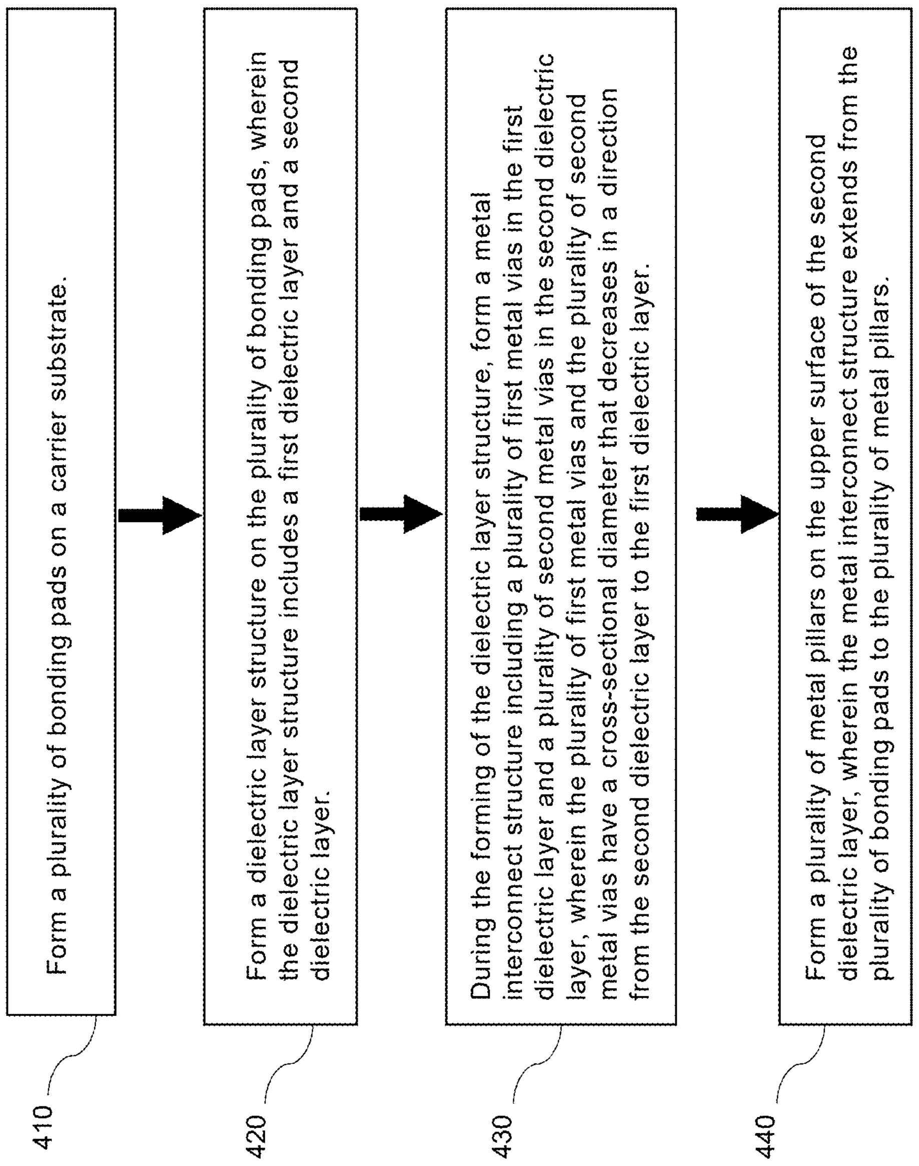
FIG. 4 is a flow chart illustrating a method of forming a package structure according to one or more embodiments.

FIG. 4 is a flow chart illustrating a method of forming a package structure according to one or more embodiments. Step 410 includes forming a plurality of bonding pads on a carrier substrate. Step 420 includes forming a dielectric layer structure on the plurality of bonding pads, wherein the dielectric layer structure includes a first dielectric layer and a second dielectric layer. Step 430 includes during the forming of the dielectric layer structure, forming a metal interconnect structure including a plurality of vias in the first dielectric layer and the second dielectric layer, wherein the plurality of vias have a cross-sectional diameter that decreases in a direction from the second dielectric layer to the first dielectric layer. Step 440 includes forming a plurality of metal pillars on the upper surface of the second dielectric layer, wherein the metal interconnect structure extends from the plurality of bonding pads to the plurality of metal pillars.

Figure 5:
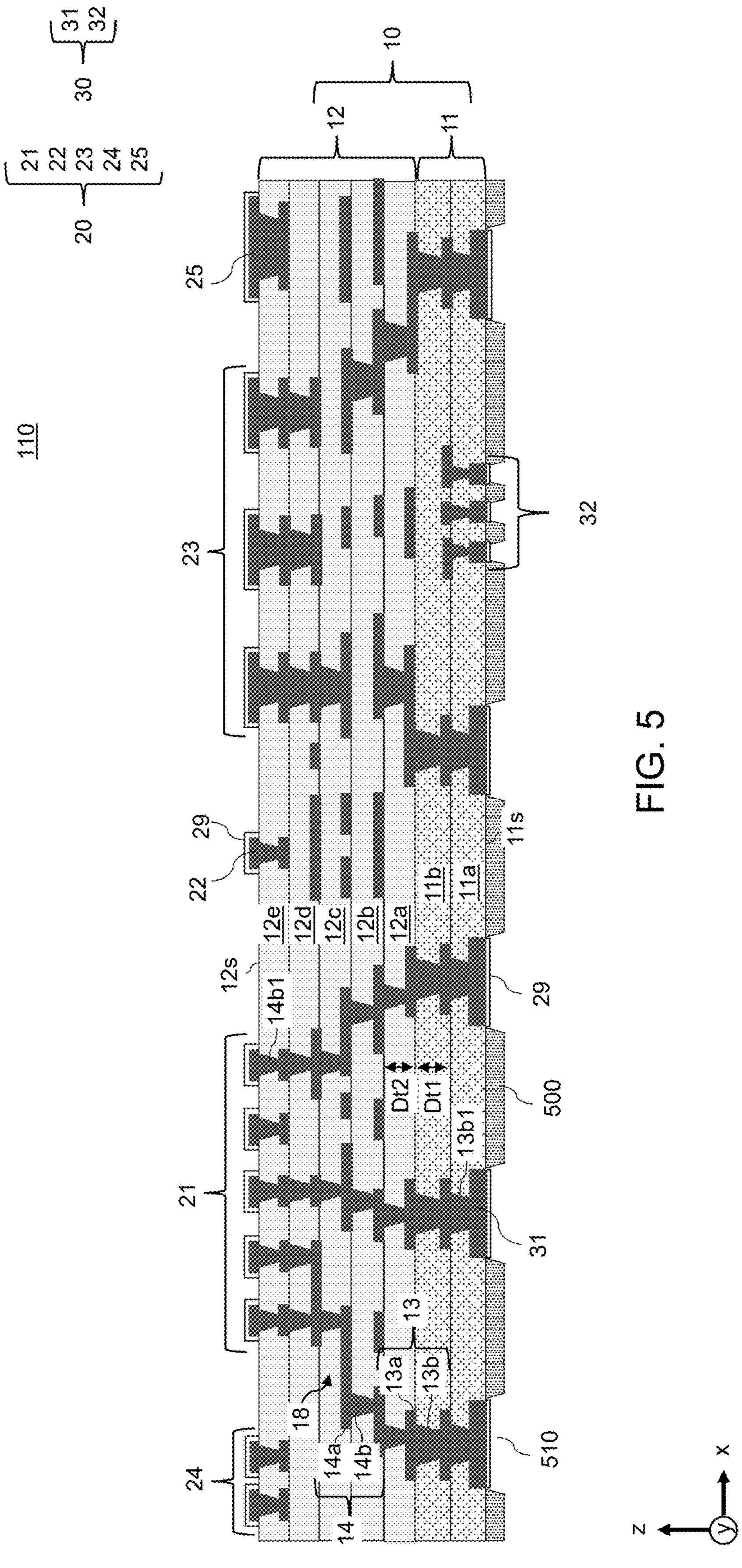
FIG. 5 is a vertical cross-sectional view of a first alternative design of the package substrate according to an embodiment of the present invention.

FIG. 5 is a vertical cross-sectional view of a first alternative design of the package substrate 110 according to an embodiment of the present invention. As illustrated in FIG. 5, in the first alternative design, the package substrate 110 may include a solder resist layer 500 (e.g., solder mask). The solder resist layer 500 may be formed on the lower surface 11*s* of the first dielectric layers 11. Solder resist openings (SROs) 510 may be formed in the solder resist layer 500 to expose a bottom surface of the bonding pads 30 (e.g., to expose the surface coating 29 on the bottom surface of the bonding pads 30).

The solder resist layer 500 may include a thin layer of polymer material (e.g., epoxy polymer). The solder resist layer 500 may have a thickness in a range from about 2 μm to 25 μm. Greater or lesser thickness of the solder resist layer may be used. The solder resist layer 500 may protect the bonding pads 30 and other metal features from oxidation. The solder resist layer may also prevent solder bridges (e.g., unintended electrical connections) from forming between closely spaced metal features.

The solder resist layer 500 may include a polymer material and applied as a liquid photo-imageable film. The liquid photo-imageable film can be applied, for example, by silk-screening or spraying the liquid photo-image-able film onto the surface of the package substrate 110 and over the bonding pads 30. The solder resist layer 500 may alternatively be applied as a dry-film photo-imageable film that may be vacuum-laminated onto the surface of the package substrate 110 and over the bonding pads 30.

The SROs 510 may be formed in the solder resist layer 500, for example, by using a photolithographic process. The photolithographic process may include forming a patterned photoresist mask (not shown) on the solder resist layer 500, and etching (e.g., wet etching, dry etching, etc.) the exposed upper surface of the solder resist layer 500 through openings in the photoresist mask. The photoresist mask may be subsequently removed by ashing, dissolving the photoresist mask or by consuming the photoresist mask during the etch process. After the SROs 510 are formed, the solder resist layer 500 may be cured such as by a thermal cure or ultraviolet (UV) cure.

Figure 6A:
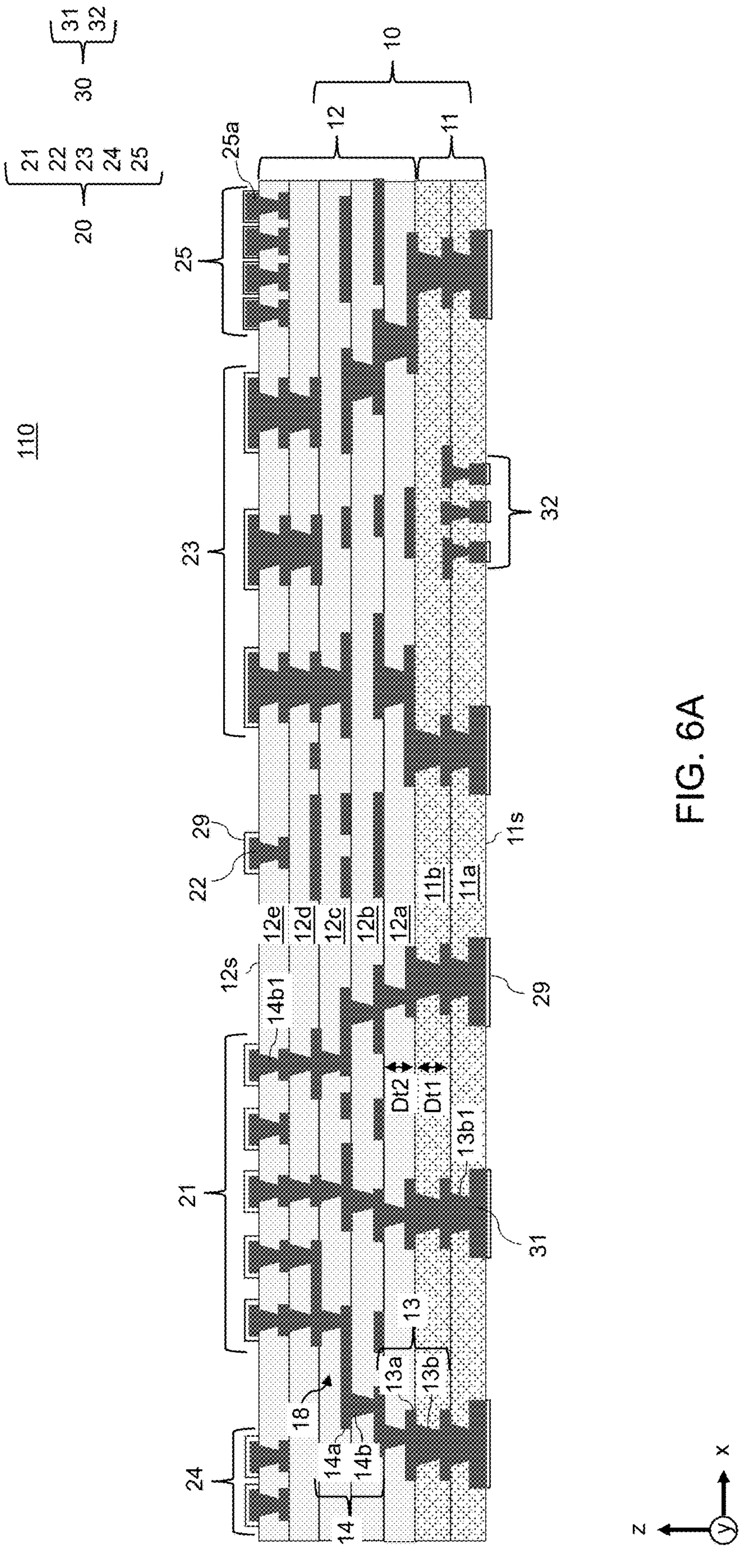
FIG. 6A is a vertical cross-sectional view of the second alternative design of the package substrate according to an embodiment of the present invention.

FIGS. 6A-6D are various views of a second alternative design of the package substrate 110 according to an embodiment of the present invention. FIG. 6A is a vertical cross-sectional view of the second alternative design of the package substrate 110 according to an embodiment of the present invention. FIG. 6B is a vertical cross-sectional view of the upper 2DID pad 25 according to an embodiment of the present invention. FIG. 6C is a plan view (top down view) of the plurality of identification pads 25*a* having a square shape according to an embodiment of the present invention. FIG. 6D is a plan view (top down view) of the plurality of identification pads 25*a* having a circular shape according to an embodiment of the present invention.

As illustrated in FIG. 6A, in the second alternative design, the upper 2DID pad 25 may include a plurality of identification pads 25*a* on the upper surface 12*s* of the second dielectric layers 12. In at least one embodiment, a number of the identification pads 25*a* in the upper 2DID pad 25 may be in a range from 2 to 20. However, other numbers of identification pads 25*a* may be used. The plurality of identification pads 25*a* may be formed of the same material used in the upper 2DID pad 25 of the original design (see FIG. 1).

As illustrated in FIG. 6B, the plurality of identification pads 25*a* may have an upper 2DID pad height Jh in a range from 2 μm to 30 μm. The uppermost second metal via 14*b*1 on which the plurality of identification pads 25*a* are located may have a top diameter JVt in a range from 10 μm to 70 μm and a bottom diameter JVb in a range from 1 μm to 70 μm. The bottom diameter JVb may be less than or equal to the top diameter JVt. In at least one embodiment, the bottom diameter JVb may be substantially less than the top diameter JVt (e.g., less than 80% of the top diameter JVt).

As illustrated in FIGS. 6C-6D, the plurality of identification pads 25*a* may be arranged, for example, in a two-dimensional array extending in the x-direction and y-direction on the upper surface 12*s* of the second dielectric layers 12. As illustrated in FIG. 6C, the plurality of identification pads 25*a* may having a square shape may have an upper 2DID pad x-dimension Jx in a range from 20 μm to 100 μm and an upper 2DID pad y-dimension Jy in a range from 20 μm to 100 μm. The plurality of identification pads 25*a* may also have an upper 2DID pad pitch Jp in a range from 30 μm to 50 μm.

As illustrated in FIG. 6D, the plurality of identification pads 25*a* with a circular shape may have a pad diameter Jd in a range from 20 μm to 100 μm. In at least one embodiment, the diameter Jd of the plurality of identification pads 25*a* may be less than a diameter of the CSP pads 23. Other dimensional values of the plurality of identification pads 25*a* are within the contemplated scope of disclosure.

Figure 7A:
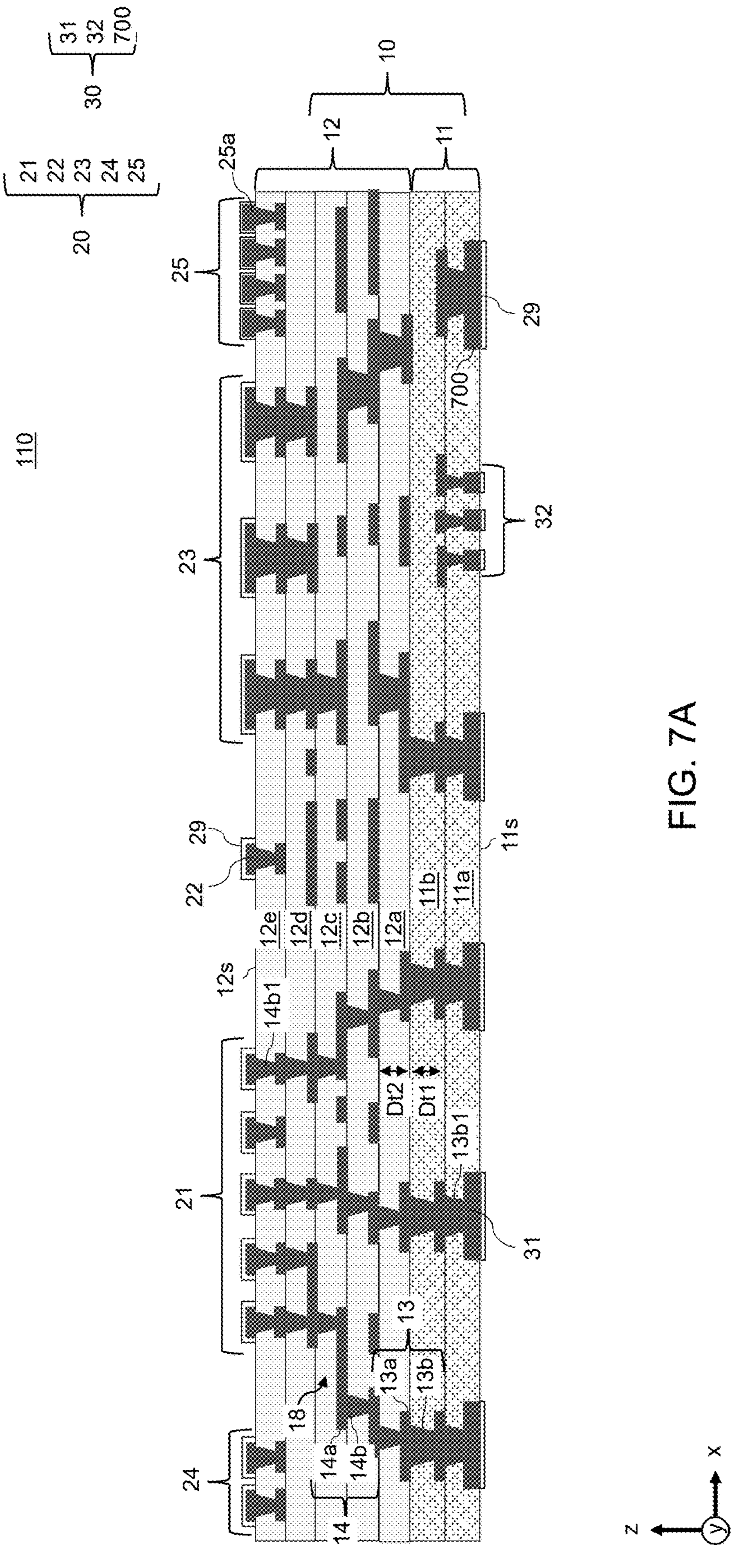
FIG. 7A is a vertical cross-sectional view of the third alternative design of the package substrate according to an embodiment of the present invention.

FIGS. 7A-7E are various views of a third alternative design of the package substrate 110 according to an embodiment of the present invention. FIG. 7A is a vertical cross-sectional view of the third alternative design of the package substrate 110 according to an embodiment of the present invention. FIG. 7B is a vertical cross-sectional view of a lower 2DID pad 700 in the package substrate 110 according to an embodiment of the present invention. FIG. 7C is a plan view (bottom-up view) of the lower 2DID pad 700 having a single square shape according to an embodiment of the present invention. FIG. 7D is a plan view (bottom-up view) of the lower 2DID pad 700 having a plurality of identification pads 700*a* with a square shape according to an embodiment of the present invention. FIG. 7E is a plan view (bottom-up view) of the plurality of identification pads 700*a* having a circular shape according to an embodiment of the present invention.

As illustrated in FIG. 7A, the bonding pads 30 in the third alternative design of the package substrate 110 may include a lower 2DID pad 700 in the first dielectric layers 11. The 2DID pad 700 may be exposed at the lower surface 11*s* of the first dielectric layers 11. A design, shape and function of the lower 2DID pad 700 may be substantially the same as the design, shape and function of the upper 2DID pad 25 (see FIG. 1). The lower 2DID pad 700 may be formed concurrently with the other bonding pads 30. The lower 2DID pad 700 may also be formed of the same materials as the other bonding pads 30.

As illustrated in FIG. 7B, the lower 2DID pad 700 may have a lower 2DID pad height Jho in a range from 0 μm to 30 μm. The lower 2DID pad 700 may also have a lower 2DID pad thickness Jh in a range from 2 μm to 30 μm. The lowermost first metal via 13*b*1 contacting the lower 2DID pad 700 may have a top diameter JVt in a range from 10 μm to 200 μm and a bottom diameter JVb in a range from 1 μm to 200 μm. The bottom diameter JVb may be less than or equal to the top diameter JVt. In at least one embodiment, the bottom diameter JVb may be substantially less than the top diameter JVt (e.g., less than 80% of the top diameter JVt). As illustrated in FIG. 7C, the lower 2DID pad 700 may have a single square shape. As further illustrated in FIG. 7C, the lower 2DID pad 700 may have a lower 2DID pad x-dimension Jx in a range from 20 μm to 3000 μm and a lower 2DID pad y-dimension Jy in a range from 20 μm to 3000 μm.

As illustrated in FIGS. 7D-7E, the lower 2DID pad 700 may include a plurality of identification pads 700*a* arranged, for example, in a two-dimensional array extending in the x-direction and y-direction on the lower surface 11*s* of the first dielectric layers 11. As illustrated in FIG. 7D, the plurality of identification pads 700*a* may having a square shape may have a lower 2DID pad x-dimension Jx in a range from 20 μm to 100 μm and a lower 2DID pad y-dimension Jy in a range from 20 μm to 100 μm. The plurality of identification pads 700*a* may also have a lower 2DID pad pitch Jp in a range from 30 μm to 50 μm.

As illustrated in FIG. 7E, the plurality of identification pads 700*a* with a circular shape may have a pad diameter Jd in a range from 20 μm to 100 μm. In at least one embodiment, the diameter Jd of the plurality of identification pads 700*a* may be less than a diameter of the CSP pads 23. Other dimensional values of the plurality of identification pads 700*a* are within the contemplated scope of disclosure.

Figure 8A:
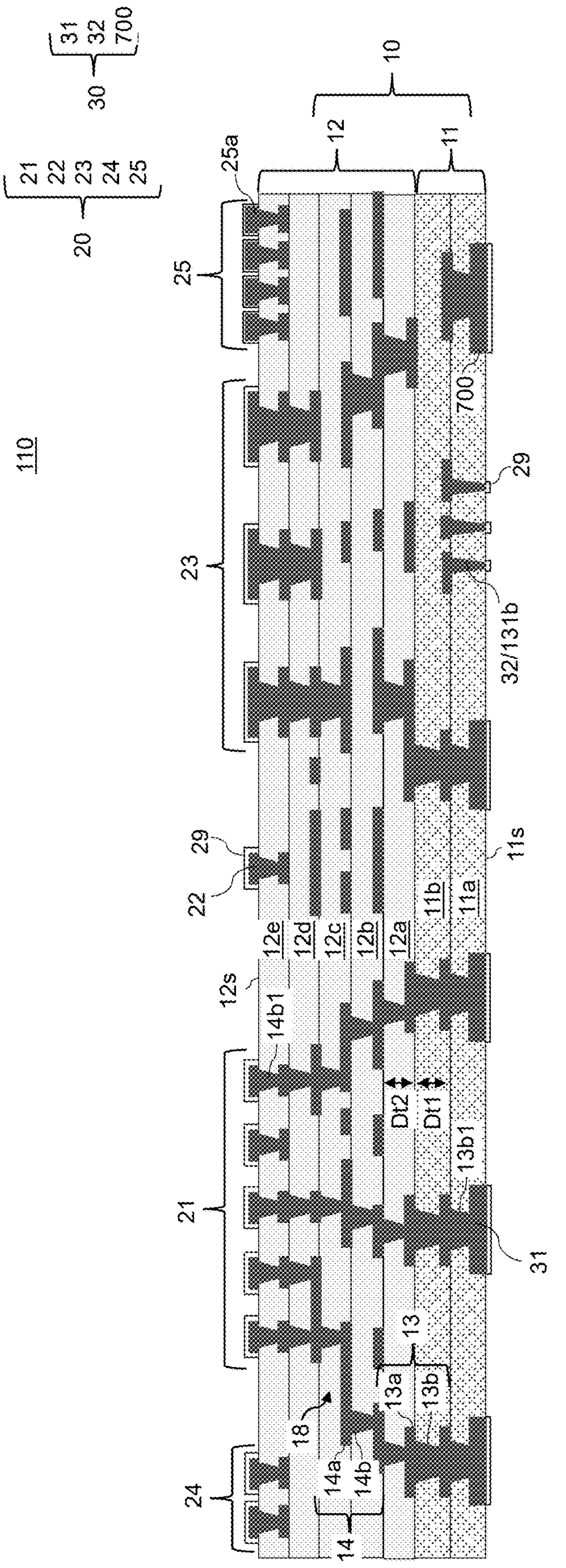
FIG. 8A is a vertical cross-sectional view of the fourth alternative design of the package substrate according to an embodiment of the present invention.

FIGS. 8A-8B are various views of a fourth alternative design of the package substrate 110 according to an embodiment of the present invention. FIG. 8A is a vertical cross-sectional view of the fourth alternative design of the package substrate 110 according to an embodiment of the present invention. FIG. 8B is a vertical cross-sectional view of the lower SMD pads 32 in the package substrate 110 according to an embodiment of the present invention.

As illustrated in FIG. 8A, in the fourth alternative design the lowermost first metal via 131*b* may be extended down to the lower surface 11*s* of the first dielectric layers 11. The lower surface of the lowermost first metal vias 32 may be substantially coplanar with the lower surface 11*s* of the first dielectric layers 11. In at least one embodiment, the lower surface of the lowermost first metal vias 32 may not extend in the z-direction beyond the lower surface 11*s* of the first dielectric layers 11. That is, in at least one embodiment, an entirety of the lowermost first metal vias 32 (except for the lower surface) may be embedded in the first dielectric layer 11*a*.

The lowermost first metal vias 131*b* may therefore serve as the lower SMD pads 32 in the fourth alternative design. The surface coating 29 may be formed on the lower surface of the lowermost first metal vias 131*b*.

As illustrated in FIG. 8B, the lower SMD pads 32 may have a lower SMD pad height Mho in a range from 0 μm to 30 μm. The lower SMD pads 32 may have a lower SMD pad thickness Mhi in a range from 2 μm to 50 μm. The lower SMD pads 32 may have a lower SMD pad diameter Md in a range from 10 μm to 300 μm. The lower SMD pads 32 may have a lower SMD pad pitch Mp in a range from 20 μm to 350 μm. Other dimensional values of the lower SMD pads 32 are within the contemplated scope of disclosure.

The lowermost first metal vias 13*b*1 that serve as the lower SMD pads 32 may have a top diameter MVt in a range from 20 μm to 250 μm and a bottom diameter MVb in a range from 1 μm to 250 μm. The bottom diameter MVb may be less than or equal to the top diameter MVt. In at least one embodiment, the bottom diameter MVb may be substantially less than the top diameter MVt (e.g., less than 80% of the top diameter MVt).

Figure 9A:
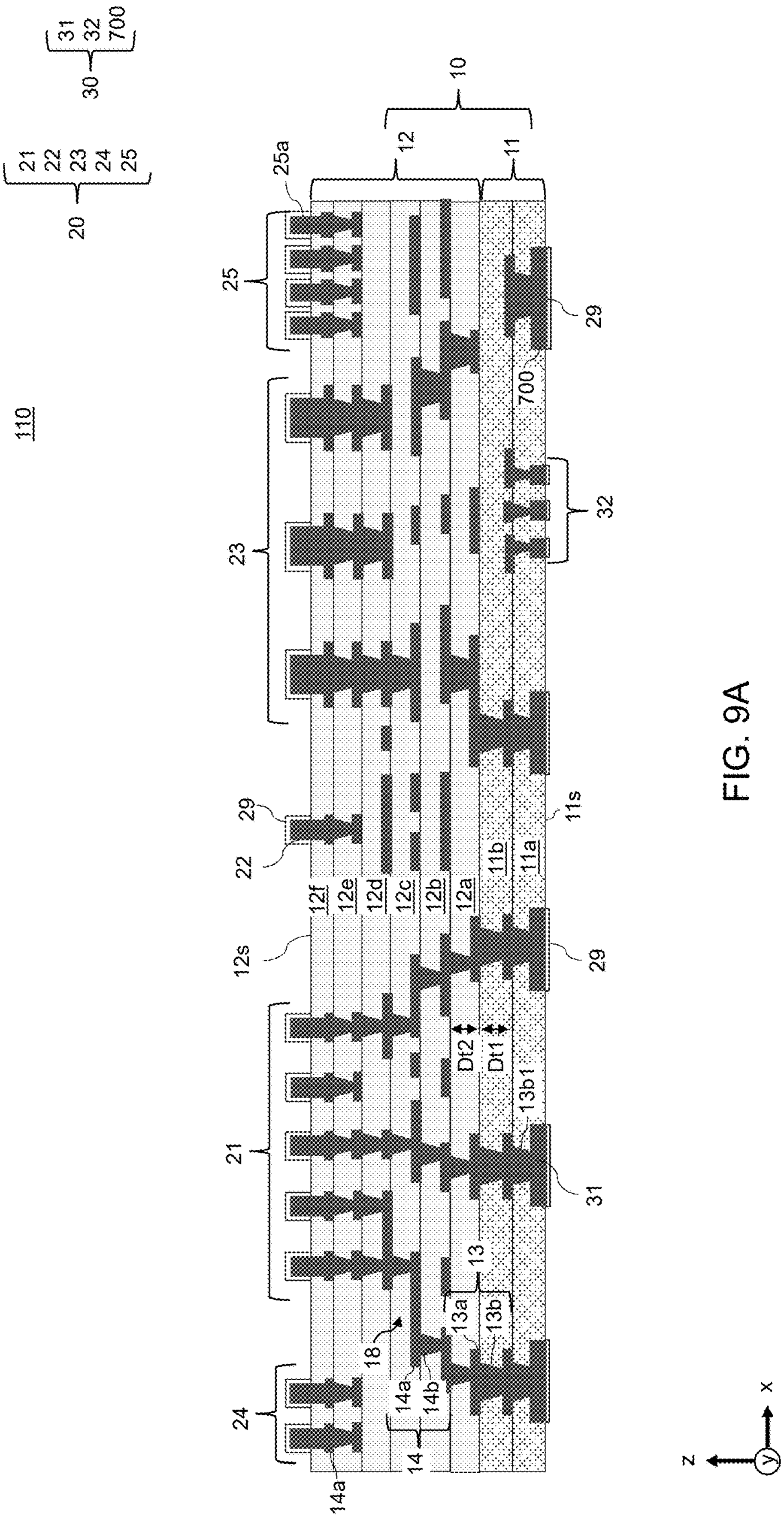
FIG. 9A is a vertical cross-sectional view of the package substrate having the fifth alternative design according to one or more embodiments.

FIGS. 9A-9F are various views of a fifth alternative design of the package substrate 110 according to an embodiment of the present invention. FIG. 9A is a vertical cross-sectional view of the package substrate 110 having the fifth alternative design according to one or more embodiments.

The fifth alternative design may be substantially similar to the third alternative design in FIG. 7A. However, in contrast to the third alternative design, in the fifth alternative design, the second dielectric layers 12 may include second dielectric layer 12*a* (e.g., lowermost second dielectric layer 12*a*), second dielectric layer 12*b*, second dielectric layer 12*c*, second dielectric layer 12*d*, second dielectric layer 12*e*, and second dielectric layer 12*f* (e.g., uppermost second dielectric layer 12*f*). In further contrast to the third alternative design, the fifth alternative design may not include uppermost second metal vias 14*b*1. Instead, the fifth alternative design may include the second dielectric layer 12*f* and a portion of the metal pillars 20 may be located within the second dielectric layer 12*f*. Further, the metal pillars 20 may have a substantially uniform cross-sectional size (e.g., diameter or x-dimension) inside and outside the second dielectric layer 12*f*. That is, the size (e.g., diameter or x-dimension) of the metal pillars 20 inside the second dielectric layer 12*f* may be substantially the same as a size of the metal pillars 20 outside the second dielectric layer 12*f*.

The method of forming the fifth alternative design may be substantially the same as that described above for the original design and illustrated in FIGS. 3A-3F. However, in the fifth alternative design, the upper 2DID pad 25 is formed as the plurality of identification pads 25*a* (e.g., see FIGS. 6A-6D). In addition, the fifth alternative design includes the lower 2DID pad 700 (e.g., see FIGS. 7A-7E).

Further, in the method of forming the fifth alternative design, instead of forming the metal pillars 20 on the upper surface of the second dielectric layer 12*e*, second metal traces 14*a* may be formed on the upper surface of the second dielectric layer 12*e*. The second metal traces may be formed by depositing a layer of metal material of the upper surface of the second dielectric layer 12*e*, forming a first photoresist layer on the layer of metal material, patterning the first photoresist layer, etching the layer of metal material through the patterned first photoresist layer, then removing the patterned first photoresist layer.

The metal pillars 20 may then be formed on the metal traces 14*a* on the upper surface of the second dielectric layer 12*e*. In particular, the metal vias 20 may be formed by forming a second photoresist layer on the metal traces 14*a*, patterning the second photoresist layer, depositing a layer of metal material onto the metal traces 14*a* through the patterned second photoresist layer, then removing the patterned first photoresist layer to expose the upper surface of the second dielectric layer 12*e*. The second dielectric layer 12*f* may then be formed on the upper surface of the second dielectric layer 12*e*, and etched back to expose an upper portion of the metal pillars 20 (e.g., the portion projecting upward from the upper surface of the second dielectric layer 12*f*). The surface coating 29 may then be applied to the metal pillars 20 as illustrated in FIG. 9A.

Figure 9B:
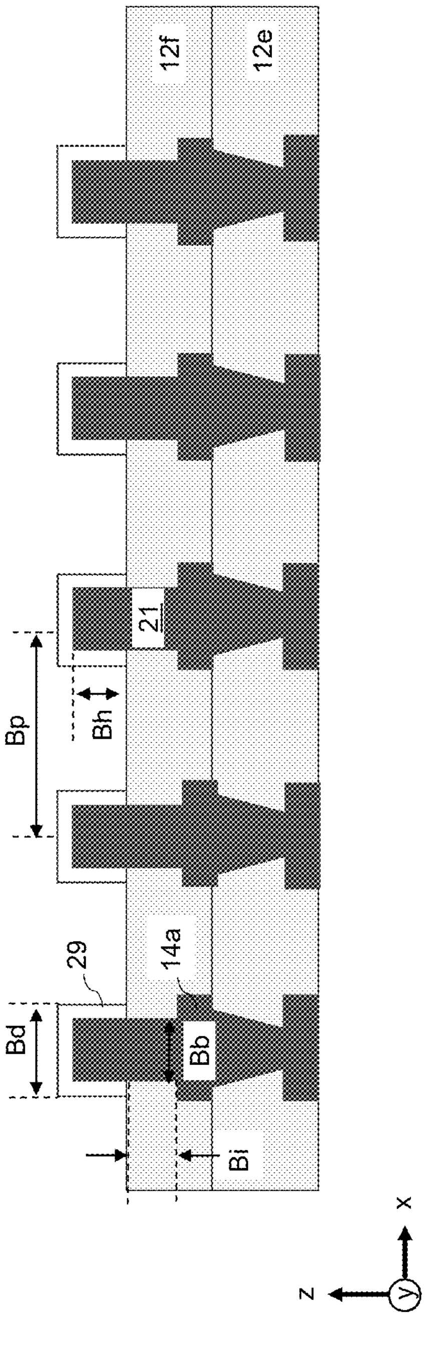
FIG. 9B is a vertical cross-sectional view of the C4 metal bumps according to one or more embodiments.

FIG. 9B is a vertical cross-sectional view of the C4 metal bumps 21 according to one or more embodiments. As illustrated in FIG. 9B, the C4 metal bumps 21 may contact the upper surface of the second metal traces 14*a* within the uppermost second dielectric layer 12*f*.

The C4 metal bumps 21 may have a C4 metal bump height Bh in a range from 2 μm to 30 μm. The C4 metal bumps 21 may have a C4 metal bump height in dielectric Bi in a range from 0 μm to 20 μm. The C4 metal bumps 21 may have a C4 metal bump pitch Bp in a range from 55 μm to 200 μm. The C4 metal bumps 21 may have an C4 metal bump diameter Bd (including the surface coating 29) in a range from 20 μm to 100 μm. The C4 metal bumps 21 may have an C4 metal bump diameter in dielectric Bb (no surface coating 29) in a range from 20 μm to 100 μm. Other dimensional values of the C4 metal bumps 21 are within the contemplated scope of disclosure.

Figure 9C:
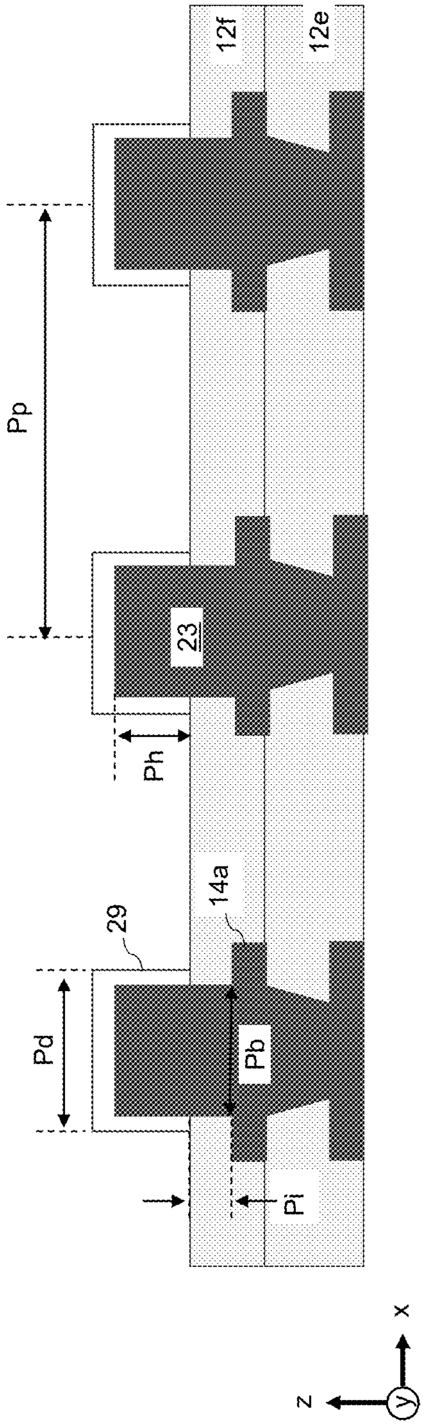
FIG. 9C is a vertical cross-sectional view of the CSP pads according to one or more embodiments.

FIG. 9C is a vertical cross-sectional view of the CSP pads 23 according to one or more embodiments. As illustrated in FIG. 9B, the CSP pads 23 may contact the upper surface of the second metal traces 14*a* within the uppermost second dielectric layer 12*f*. The CSP pads 23 may have an CSP pad height Ph in a range from 2 μm to 30 μm. The CSP pads 23 may have an CSP pad height in dielectric Pi in a range from 2 μm to 20 μm. The CSP pads 23 may have an CSP pad diameter (including the surface coating) Pd in a range from 100 μm to 750 μm. The CSP pads 23 may have an CSP pad diameter in dielectric (no surface coating) Pb in a range from 100 μm to 750 μm. The CSP pads 23 may have an CSP pad pitch Pp in a range from 150 μm to 1500 μm. Other dimensional values of the CSP pads 23 are within the contemplated scope of disclosure.

Figure 9D:
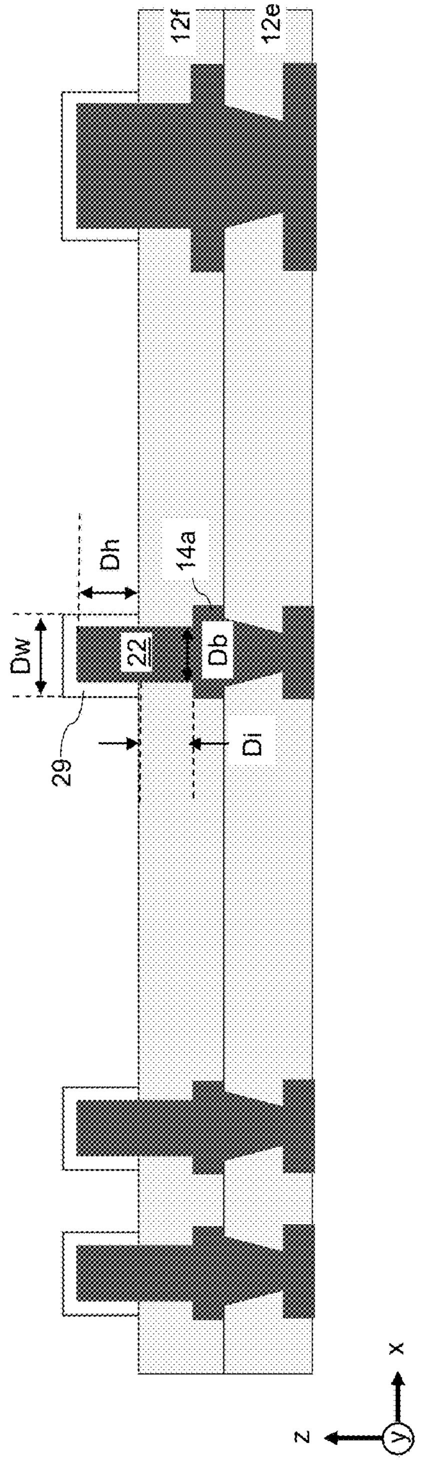
FIG. 9D is a vertical cross-sectional view of the metal dam according to one or more embodiments

FIG. 9D is a vertical cross-sectional view of the metal dam 22 according to one or more embodiments. As illustrated in FIG. 9C, the metal dam 22 may contact the upper surface of the second metal traces 14*a* within the uppermost second dielectric layer 12*f*. The metal dam 22 may have a metal dam height Dh in a range from 2 μm to 30 μm. The metal dam 22 may have a metal dam height in dielectric Di in a range from 2 μm to 20 μm. The metal dam 22 may have a metal dam width on surface (including the surface coating 29) Dw in a range from 20 μm to 250 μm. The metal dam 22 may have a metal dam width in dielectric (no surface coating 29) Db in a range from 20 μm to 250 μm. Other dimensional values of the metal dam 22 are within the contemplated scope of disclosure.

Figure 9E:
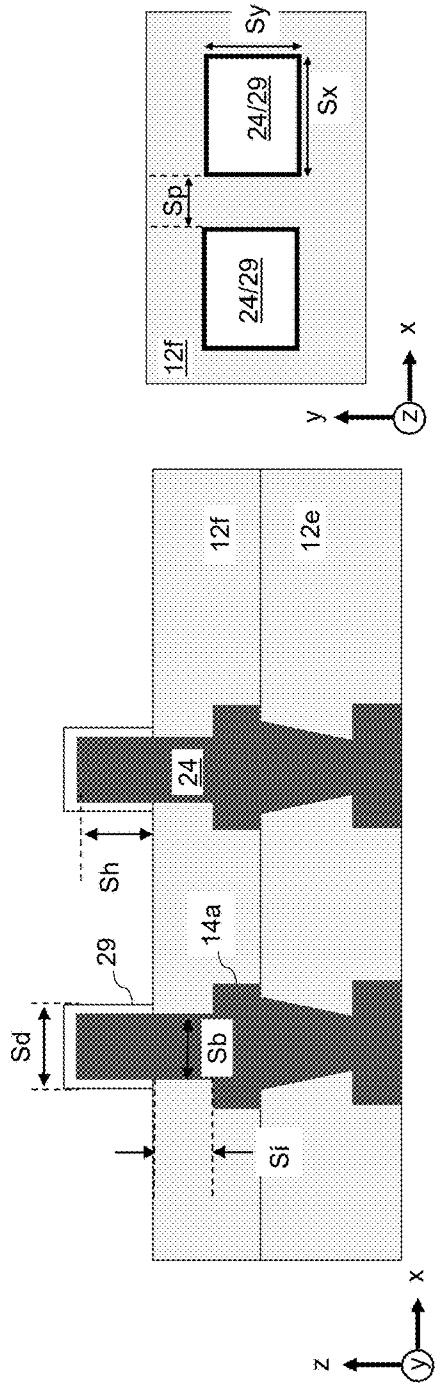
FIG. 9E is a vertical cross-sectional view of the upper SMD pads (the left side of FIG. 9E) and a plan view (top down view) of the upper SMD pads (right side of FIG. 9E) according to one or more embodiments.

FIG. 9E is a vertical cross-sectional view of the upper SMD pads 24 (the left side of FIG. 9E) and a plan view (top down view) of the upper SMD pads 24 (right side of FIG. 9E) according to one or more embodiments. As illustrated in FIG. 9E, the upper SMD pads 24 may contact the upper surface of the second metal traces 14*a* within the uppermost second dielectric layer 12*f*. The upper SMD pads 24 may have an upper SMD pad height Sh in a range from 2 μm to 30 μm. The upper SMD pads 24 may have an upper SMD pad height in dielectric Si in a range from 2 μm to 20 μm. The upper SMD pads 24 may have an upper SMD pad x-dimension Sx in a range from 20 μm to 10000 μm. The upper SMD pads 24 may also have an upper SMD pad y-dimension Sy in a range from 20 μm to 10000 μm. The upper SMD pads 24 may have an upper SMD pad to pad distance Sp in a range from 10 μm to 10000 μm. Other dimensional values of the upper SMD pads 24 are within the contemplated scope of disclosure.

FIG. 9F is a vertical cross-sectional view of the upper 2DID pad 25 according to one or more embodiments. As illustrated in FIG. 9E, the upper 2DID pad 25 may contact the upper surface of the second metal traces 14*a* within the uppermost second dielectric layer 12*f*. The upper 2DID pad 25 may be formed as a plurality of identification pads 25*a* as illustrated in FIG. 9E (e.g., see also FIGS. 7D-7E) or as a single pad as in the original design (e.g., see FIGS. 1 and 7B-7C).

The upper 2DID pad 25 may have a 2DID pad height Dh in a range from 2 μm to 30 μm. The upper 2DID pad 25 may have a 2DID pad height in dielectric Di in a range from 2 μm to 20 μm. The upper 2DID pad 25 may have a 2DID pad x-dimension Jx (e.g., see FIGS. 7C-7D) in a range from 20 μm to 3000 μm and an upper 2DID pad y-dimension Jy in a range from 20 μm to 3000 μm (e.g., see FIGS. 7C-7D). The upper 2DID pad 25 may have a 2DID pad diameter Jd (e.g., see FIG. 7E) in a range from 2 μm to 3000 μm. The upper 2DID pad 25 may have a 2DID pad pitch Jp in a range from 30 μm to 150 μm. The upper 2DID pad 25 may have a 2DID pad pitch x or y dimension or diameter in dielectric Jr in a range from 20 μm to 3000 μm. Other dimensional values of the upper 2DID pad 25 are within the contemplated scope of disclosure.

Figure 10:
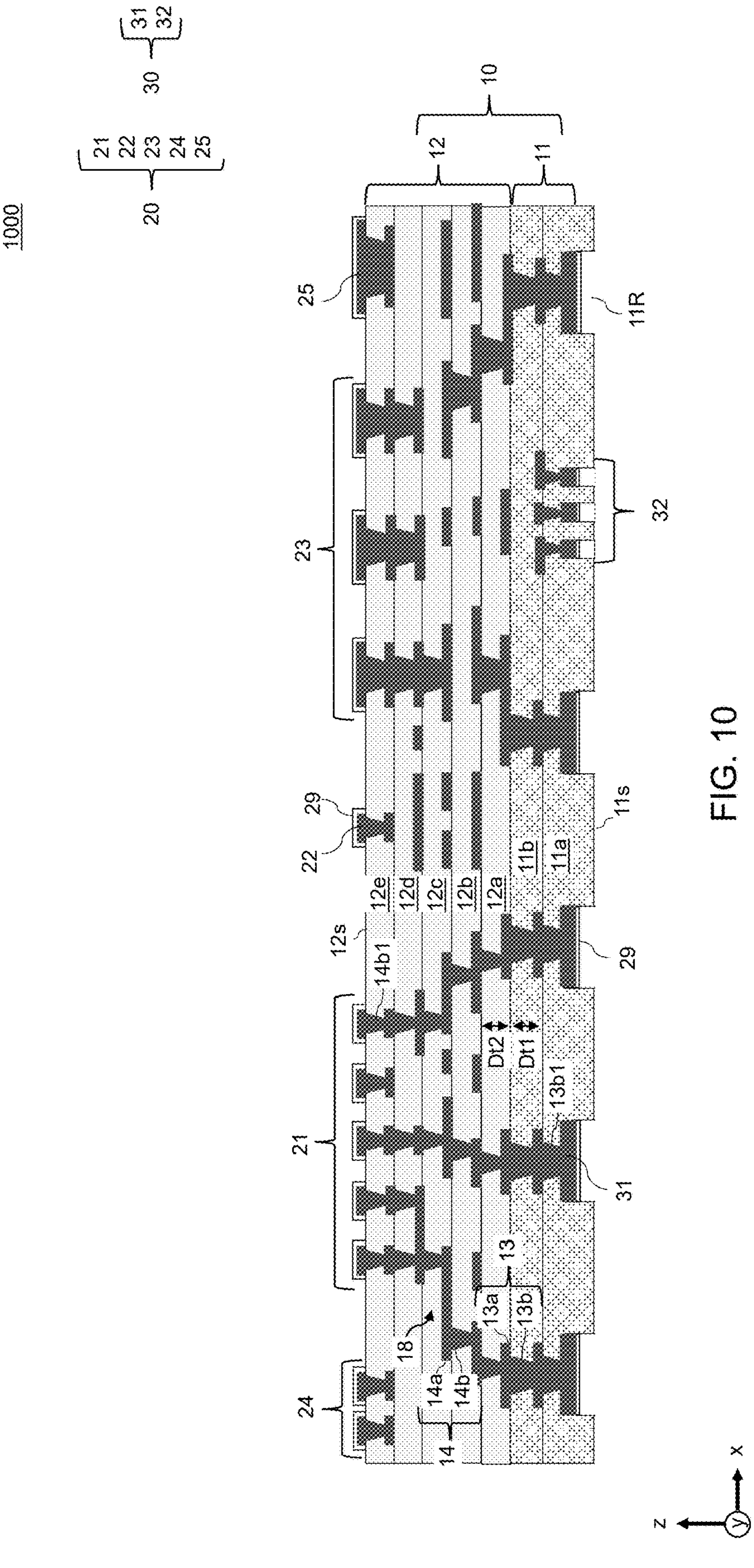
FIG. 10 is a vertical cross-sectional view of a sixth alternative design of the package substrate according to one or more embodiments.

FIG. 10 is a vertical cross-sectional view of a sixth alternative design of the package substrate 110 according to one or more embodiments. As illustrated in FIG. 10, the package substrate 110 having the sixth alternative design may be substantially the same as the package substrate 110 having the original design in FIG. 1. However, in contrast to the original design, in the sixth alternative design may include the bonding pads 30 within (e.g., embedded in) the lowermost first dielectric layer 11*a*. That is, the lowermost first dielectric layer 11*a* may include a plurality of recessed portions 11R and the bonding pads 30 may be located in the plurality of recessed portions 11R, respectively. A depth of the recessed portions 11R (e.g., depth of the bonding pads 30 in the recessed portions 11R) may be in a range from 0 μm to 25 μm. Other depths are within the contemplated scope of disclosure.

The method of forming the sixth alternative design may be substantially the same as that described above for the original design and illustrated in FIGS. 3A-3F. However, in the sixth alternative design, the recessed portions 11R may additionally be formed. In at least one embodiment, the recessed portions 11R may be formed first depositing a nickel layer on the carrier substrate 5 (e.g., see FIG. 3A). The nickel layer may have a thickness in a range from 0 μm to 25 μm (e.g., the desired depth of the recessed portions 11R).

The layer of metal material for the bonding pads 30 may then be deposited in the nickel layer. The nickel layer may then be patterned along with the layer of metal material for the bonding pads 30 (e.g., see FIG. 3B). Then at the end of the entire process, after removing the carrier substrate 5, the nickel layer may be removed (e.g., by a suitable etching process) to form the recessed portions 11R in the first dielectric layer 11*a.*

Figure 11:
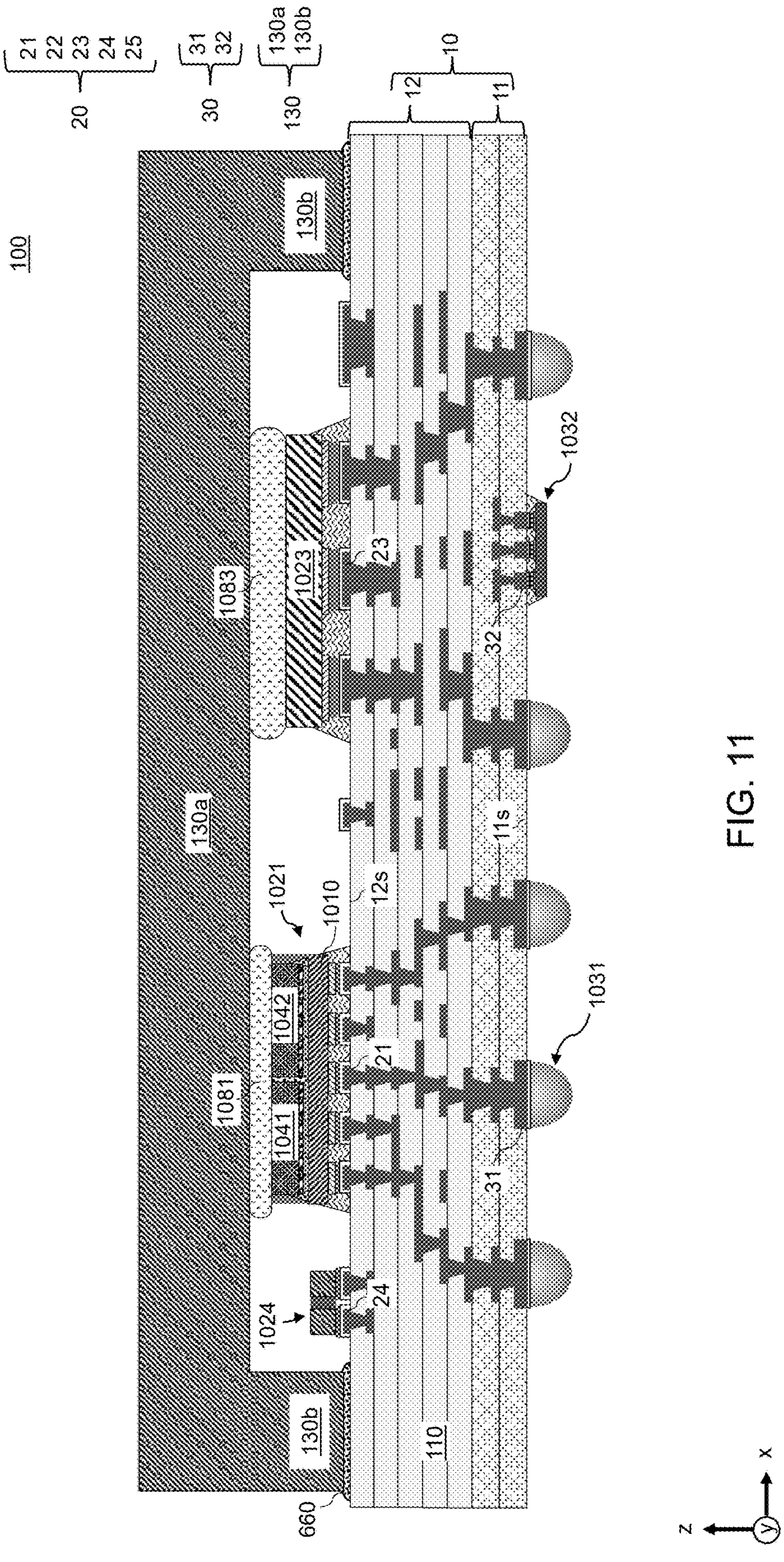
FIG. 11 is a vertical cross-sectional view of a package structure including the package substrate according to one or more embodiments.

FIG. 11 is a vertical cross-sectional view of a package structure 100 including the package substrate 110 according to one or more embodiments. As illustrated in FIG. 11, the package structure 100 may include an upper SMD 1024 on the upper SMD pads 24 and a lower SMD 1032 on the lower SMD pads 32.

The package structure 100 may include an interposer module 1021 (e.g., system on chip (SOC)) on the C4 metal bumps 21. The interposer module 1021 may include an interposer 1010 (e.g., organic interposer or inorganic interposer) and a plurality of first semiconductor dies 1041 and a plurality of second semiconductor dies 1042 on the interposer 1010. A thermal interface material (TIM) film 1081 may be located on the interposer module 1021.

The plurality of first semiconductor dies 1041 and the plurality of second semiconductor dies 1042 may include, for example, a semiconductor chip or chiplet for a high performance computing (HPC) application, an artificial intelligence (AI) application, and a 5G cellular network application. In at least one embodiment, the plurality of first semiconductor dies 1041 and the plurality of second semiconductor dies 1042 may include a logic die (e.g., mobile application processor, microcontroller, etc.), or a memory die (e.g., dynamic random access memory (DRAM) die, a Wide I/O die, a M-RAM die, a R-RAM die, a NAND die, static random access memory (SRAM), etc.). In at least one embodiment, the plurality of first semiconductor dies 1041 and the plurality of second semiconductor dies 1042 may include a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., a co-processor, accelerator, an on-chip memory buffer, a memory cube (e.g., HBM, HMC, etc.), a high data rate transceiver die, a I/O interface die, a IPD die (e.g., integrated passives device), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a monolithic 3D heterogeneous chiplet stacking die, etc.

The package structure 100 may also include a CSP 1023 on the CSP pads 23. The CSP 1023 may have a substantially structure and function as the plurality of first semiconductor dies 1041 and the plurality of second semiconductor dies 1042. A thermal interface material (TIM) film 1083 may be located on the CSP 1023.

The interposer module 1021, CSP 1023, upper SMD 1024 and lower SMD 1032 may be fixed to the package substrate 110 by solder bumps. The package structure 100 may also include a ball grid array (BGA) including a plurality of solder balls 1031 on the BGA bonding pads 31.

A package lid 130 may also be attached to the upper surface 12*s* of the second dielectric layers 12. The package lid 130 may be formed of a metal (e.g., copper) or ceramic material. Other materials may be used within the contemplated scope of disclosure. The package lid 130 may include a package lid plate portion 130*a* over the upper SMD 1024 the interposer module 1021 and the CSP 1023. The package lid plate portion 130*a* may compress the TIM film 1081 on the interposer module 1021 and the TIM film 1083 on the CSP 1023.

The package lid 130 may also include a package lid foot portion 130*b* connected to the package lid plate portion 130*a*. The package lid foot portion 130*b* may be attached to the upper surface 12*s* of the second dielectric layers 12 by an adhesive layer 660 (e.g., a silicone adhesive or an epoxy adhesive).

Figure 12:
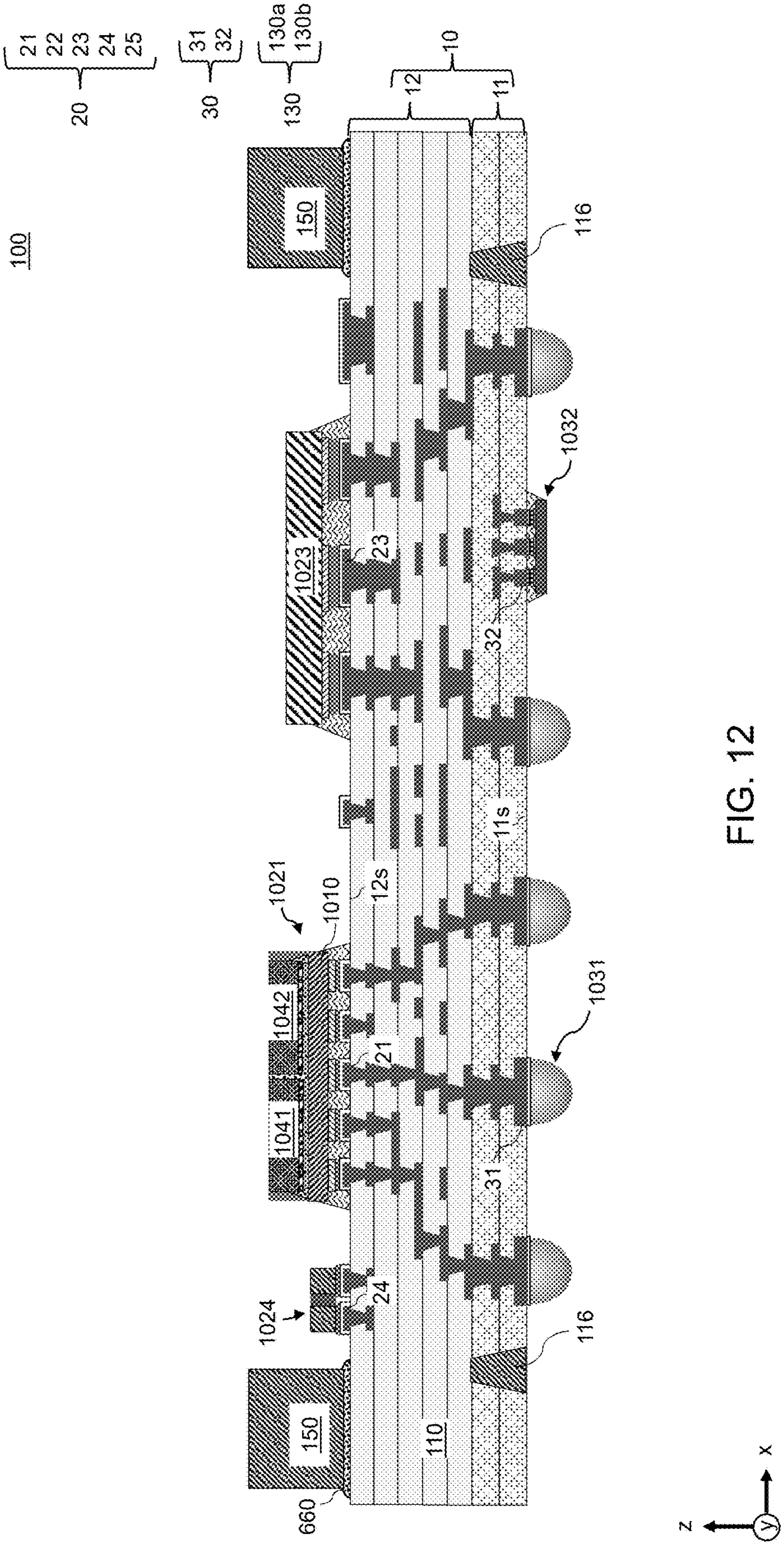
FIG. 12 is a vertical cross-sectional view of a first alternative design of the package structure according to one or more embodiments.

FIG. 12 is a vertical cross-sectional view of a first alternative design of the package structure 100 according to one or more embodiments. As illustrated in FIG. 12, the first alternative design of the package structure 100 may be substantially similar to the original design in FIG. 11. However, in the first alternative design, the package structure 100 may include a stiffener ring 150 in place of the package lid 130. In addition, in the first alternative design, the package substrate 110 may include a plurality of dummy vias 116. The plurality of dummy vias 116 may help to avoid formation of a crack in the package substrate 110 due to a strong stiffener ring design.

The stiffener ring 150 may be mounted on the package substrate 110 around the interposer module 120. The stiffener ring 150 may be securely fixed to the package substrate 110 by the adhesive layer 660. The stiffener ring 150 may be formed of a metal such as copper with a nickel coating, or an aluminum alloy. The stiffener ring 150 may provide rigidity to the package substrate 110.

The dummy vias 116 may be aligned with an edge of the stiffener ring 150. In particular, a centerline in the x-direction of the dummy via 116 may be substantially aligned with the inner edge of the stiffener ring 150. At least some portion of the dummy vias 116 may be located underneath the interposer module 1021 in the z-direction.

A lowermost surface of the dummy vias 116 may be substantially coplanar with the lower surface 11*s* of the first dielectric layers 11. The dummy vias 116 may be exposed at the lower surface 11*s* of the first dielectric layers 11 or may be covered, for example, by a layer of solder resist, a lower passivation layer, etc.

Referring to FIGS. 1-12, a package substrate 110 may include a dielectric layer structure 10 including a first dielectric layer 11 and a second dielectric layer 12, a plurality of bonding pads 30 located at a lower surface 11*s* of the first dielectric layer 11, a plurality of metal pillars 20 located on an upper surface 12*s* of the second dielectric layer 12, and a metal interconnect structure 18 extending from the plurality of bonding pads 30 to the plurality of metal pillars 20 and including a plurality of first metal vias 13*b* in the first dielectric layer 11 and a plurality of second metal vias 14*b* in the second dielectric layer 12, wherein the plurality of first metal vias 13*b* and the plurality of second metal vias 14*b* have a cross-sectional diameter that decreases in a direction from the second dielectric layer 12 to the first dielectric layer 11.

In one embodiment, the package substrate 110 may further include a solder resist layer 500 on the lower surface 11*s* of the first dielectric layer 11, wherein a surface of the plurality of bonding pads 30 may be exposed through the solder resist layer 500. In one embodiment, the plurality of metal pillars 20 may include a plurality of C4 metal bumps 21 on the upper surface 12*s* of the second dielectric layer 12, an upper surface-mounted device (SMD) pad 24 adjacent the plurality of C4 metal bumps 21 on the upper surface 12*s* of the second dielectric layer 12, a metal dam 22 adjacent the plurality of C4 metal bumps 21 on the upper surface 12*s* of the second dielectric layer 12, and a chip-scale package (CSP) pad 23 adjacent the metal dam 22 on the upper surface 12*s* of the second dielectric layer 12, wherein a diameter of the CSP pad 23 may be greater than a diameter of the plurality of C4 metal bumps 21. In one embodiment, the plurality of metal pillars 20 may also include an upper two-dimensional identification (2DID) pad 25 adjacent the CSP pad 23 on the upper surface 12*s* of the second dielectric layer 12. In one embodiment, the upper 2DID pad 25 may include a two-dimensional array including a plurality of identification pads 25*a*, and a diameter of the plurality of identification pads 25*a* may be less than a diameter of the CSP pad 23. In one embodiment, the plurality of bonding pads 30 may be embedded in the first dielectric layer 11. In one embodiment, the plurality of bonding pads 30 may include a lower two-dimensional identification (2DID) pad 700 on the lower surface 11*s* of the first dielectric layer 11. In one embodiment, the lower 2DID pad 700 may include a two-dimensional array including a plurality of identification pads 700*a*, and a diameter of the plurality of identification pads 700*a* may be less than or equal to a diameter of the CSP pad 23. In one embodiment, the plurality of bonding pads 30 may include a plurality of ball grid array (BGA) bonding pads 31 at the lower surface 11*s* of the first dielectric layer 11, and a lower surface-mounted device (SMD) pad 32 located at the lower surface 11*s* of the first dielectric layer 11. In one embodiment, the plurality of first metal vias 13*b* may include a plurality of lowermost first metal vias 13*b*1 located at the lower surface 11*s* of the first dielectric layer 11, and the plurality of lowermost first metal vias 13*b*1 may include a lower surface-mounted device (SMD) pad 32. In one embodiment, the plurality of second metal vias 14*b* may include a plurality of uppermost second metal vias 14*b*1 located at the upper surface 12*s* of the second dielectric layer 12, and the plurality of uppermost second metal vias 14*b*1 may have a substantially uniform cross-sectional diameter. In one embodiment, the plurality of uppermost second metal vias 14*b*1 may be connected to the plurality of metal pillars 20 and the cross-sectional diameter of the plurality of uppermost second metal vias 14*b*1 may be substantially the same as a cross-sectional diameter of the plurality of metal pillars 20, respectively. In one embodiment, the lower surface 11*s* of the first dielectric layer 11 may include a plurality of recessed portions and the plurality of bonding pads 30 may be located in the plurality of recessed portions, respectively. In one embodiment, at least one of the first dielectric layer 11 or the second dielectric layer 12 may include at least one of glass fibers or ceramic fibers embedded in an organic material matrix.

Referring again to FIGS. 1-12, a method of forming a package substrate 110 may be provided in which the method may include the operations of: forming a plurality of bonding pads 30 on a carrier substrate, forming a dielectric layer structure on the plurality of bonding pads 30, wherein the dielectric layer structure may include a first dielectric layer 11 and a second dielectric layer 12, forming a metal interconnect structure 18 including a plurality of first metal vias 13*b* in the first dielectric layer 11 and a plurality of second metal vias 14*b* in the second dielectric layer 12, wherein the plurality of first metal vias 13*b* and the plurality of second metal vias 14*b* have a cross-sectional diameter that decreases in a direction from the second dielectric layer 12 to the first dielectric layer 11, and forming a plurality of metal pillars 20 on the upper surface 12*s* of the second dielectric layer 12, wherein the metal interconnect structure 18 extends from the plurality of bonding pads 30 to the plurality of metal pillars 20.

In one embodiment, the method may further include forming a solder resist layer on the lower surface 11*s* of the first dielectric layer 11, wherein a surface of the plurality of bonding pads 30 may be exposed through the solder resist layer. In one embodiment, forming of the metal pillars 20 may include forming a plurality of C4 metal bumps 21 on the upper surface 12*s* of the second dielectric layer 12, forming an upper surface-mounted device (SMD) pad 24 adjacent the plurality of C4 metal bumps 21 on the upper surface 12*s* of the second dielectric layer 12, forming a metal dam 22 adjacent the plurality of C4 metal bumps 21 on the upper surface 12*s* of the second dielectric layer 12, and forming a chip-scale package (CSP) pad 23 adjacent the metal dam 22 on the upper surface 12*s* of the second dielectric layer 12, wherein a diameter of the CSP pad 23 may be greater than a diameter of the plurality of C4 metal bumps 21. In one embodiment, forming of the metal pillars 20 may further include forming an upper two-dimensional identification (2DID) pad 25 adjacent the CSP pad 23 on the upper surface 12*s* of the second dielectric layer 12. In one embodiment, forming of the upper 2DID pad 25 may include forming the upper 2DID pad 25 to include a two-dimensional array including a plurality of identification pads 25*a*, wherein a diameter of the plurality of identification pads 25*a* may be less than a diameter of the CSP pad 23. In one embodiment, forming of the plurality of bonding pads 30 may include forming a plurality of ball grid array (BGA) bonding pads 31 at the lower surface 11*s* of the first dielectric layer 11, forming a lower two-dimensional identification (2DID) pad 700 adjacent the plurality of BGA bonding pads 31 at the lower surface 11*s* of the first dielectric layer 11, and forming a lower surface-mounted device (SMD) pad 32 adjacent the plurality of BGA bonding pads 31 at the lower surface 11*s* of the first dielectric layer 11.

Referring again to FIGS. 1-12, a package structure 100 may include a package substrate 110, a dielectric layer structure including a first dielectric layer 11 and a second dielectric layer 12, a plurality of ball grid array (BGA) bonding pads 30 located at a lower surface 11*s* of the first dielectric layer 11, a plurality of metal pillars 20 located on an upper surface 12*s* of the second dielectric layer 12, wherein the plurality of metal pillars 20 may include a plurality of C4 metal bumps 21 and a plurality of chip-scale package pads, and a metal interconnect structure 18 extending from the plurality of BGA bonding pads 31 to the plurality of metal pillars 20 and including a plurality of first metal vias 13*b* in the first dielectric layer 11 and a plurality of second metal vias 14*b* in the second dielectric layer 12, wherein the plurality of first metal vias 13*b* and the plurality of second metal vias 14*b* have a cross-sectional diameter that decreases in a direction from the second dielectric layer 12 to the first dielectric layer 11. The package structure 100 may also include an interposer module 1021 on the plurality of C4 metal bumps 21, wherein the interposer module 1021 may include an interposer 1010 and a plurality of semiconductor devices 1041, 1042 on the interposer 1010, and wherein the plurality of semiconductor devices 1041, 1042 may be electrically coupled to the plurality of BGA bonding pads 30 through the metal interconnect structure 18. The package structure 100 may also include a chip-scale package 1023 on the plurality of chip-scale package pads 23 and electrically coupled to the BGA bonding pads 31 through the metal interconnect structure 18, and a package lid 130 located over the interposer module 1021 and the chip-scale package 1023 and including a package lid foot portion 130*b* attached to the package substrate 110.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package substrate, comprising:

a dielectric layer structure including a first dielectric layer and a second dielectric layer;

a plurality of bonding pads located at a lower surface of the first dielectric layer;

a plurality of metal pillars located on an upper surface of the second dielectric layer, wherein the plurality of metal pillars comprise:

a plurality of C4 metal bumps on the upper surface of the second dielectric layer;

a metal dam adjacent the plurality of C4 metal bumps on the upper surface of the second dielectric layer; and a chip-scale package (CSP) pad adjacent the metal dam on the upper surface of the second dielectric layer, wherein a diameter of the CSP pad is greater than a diameter of the plurality of C4 metal bumps; and a metal interconnect structure extending from the plurality of bonding pads to the plurality of metal pillars and including a plurality of first metal vias in the first dielectric layer and a plurality of second metal vias in the second dielectric layer, wherein the plurality of first metal vias and the plurality of second metal vias have a cross-sectional diameter that decreases in a direction from the second dielectric layer to the first dielectric layer.

2. The package substrate of claim 1, further comprising:

a solder resist layer on the lower surface of the first dielectric layer, wherein a surface of the plurality of bonding pads is exposed through the solder resist layer.

3. The package substrate of claim 1, wherein the plurality of metal pillars further comprises an upper surface-mounted device (SMD) pad adjacent the plurality of C4 metal bumps on the upper surface of the second dielectric layer.

4. The package substrate of claim 1, wherein the plurality of metal pillars further comprises:

an upper two-dimensional identification (2DID) pad adjacent the CSP pad on the upper surface of the second dielectric layer, wherein the upper 2DID pad comprises a two-dimensional array including a plurality of identification pads, and a diameter of the plurality of identification pads is less than the diameter of the CSP pad.

5. The package substrate of claim 1, wherein the plurality of bonding pads are embedded in the first dielectric layer.

6. The package substrate of claim 1, wherein the plurality of bonding pads comprises a lower two-dimensional identification (2DID) pad on the lower surface of the first dielectric layer.

7. The package substrate of claim 6, wherein the lower 2DID pad comprises a two-dimensional array including a plurality of identification pads, and a diameter of the plurality of identification pads is less than or equal to the diameter of the CSP pad.

8. The package substrate of claim 1, wherein the plurality of bonding pads comprises:

a plurality of ball grid array (BGA) bonding pads at the lower surface of the first dielectric layer; and a lower surface-mounted device (SMD) pad located at the lower surface of the first dielectric layer.

9. The package substrate of claim 1, wherein the plurality of first metal vias comprises a plurality of lowermost first metal vias located at the lower surface of the first dielectric layer, and the plurality of lowermost first metal vias comprises a lower surface-mounted device (SMD) pad.

10. The package substrate of claim 1, wherein the plurality of second metal vias comprises a plurality of uppermost second metal vias located at the upper surface of the second dielectric layer, and the plurality of uppermost second metal vias have a substantially uniform cross sectional diameter.

11. The package substrate of claim 10, wherein the plurality of uppermost second metal vias are connected to the plurality of metal pillars, respectively, and the cross-sectional diameter of the plurality of uppermost second metal vias is substantially the same as a cross-sectional diameter of the plurality of metal pillars.

12. The package substrate of claim 1, wherein the lower surface of the first dielectric layer includes a plurality of recessed portions and the plurality of bonding pads are located in the plurality of recessed portions, respectively.

13. The package substrate of claim 1, wherein at least one of the first dielectric layer or the second dielectric layer comprises at least one of glass fibers or ceramic fibers embedded in an organic material matrix.

14. A method of forming a package substrate, the method comprising:

forming a plurality of bonding pads on a carrier substrate;

forming a dielectric layer structure on the plurality of bonding pads, wherein the dielectric layer structure includes a first dielectric layer and a second dielectric layer;

forming a metal interconnect structure including a plurality of first metal vias in the first dielectric layer and a plurality of second metal vias in the second dielectric layer, wherein the plurality of first metal vias and the plurality of second metal vias have a cross-sectional diameter that decreases in a direction from the second dielectric layer to the first dielectric layer; and forming a plurality of metal pillars on an upper surface of the second dielectric layer, wherein the metal interconnect structure extends from the plurality of bonding pads to the plurality of metal pillars, wherein the forming of the plurality of metal pillars comprises:

forming a plurality of C4 metal bumps on the upper surface of the second dielectric layer;

forming a metal dam adjacent the plurality of C4 metal bumps on the upper surface of the second dielectric layer; and forming a chip-scale package (CSP) pad adjacent the metal dam on the upper surface of the second dielectric layer, wherein a diameter of the CSP pad is greater than a diameter of the plurality of C4 metal bumps.

15. The method of claim 14, further comprising:

forming a solder resist layer on a lower surface of the first dielectric layer, wherein a surface of the plurality of bonding pads is exposed through the solder resist layer.

16. The method of claim 14, wherein the forming of the plurality of metal pillars further comprises forming an upper surface-mounted device (SMD) pad adjacent the plurality of C4 metal bumps on the upper surface of the second dielectric layer.

17. The method of claim 16, wherein the forming of the metal pillars further comprises:

forming an upper two-dimensional identification (2DID) pad adjacent the CSP pad on the upper surface of the second dielectric layer.

18. The method of claim 17, wherein the forming of the upper 2DID pad comprises forming the upper 2DID pad to include a two-dimensional array including a plurality of identification pads, wherein a diameter of the plurality of identification pads is less than the diameter of the CSP pad.

19. The method of claim 14, wherein the forming of the plurality of bonding pads comprises:

forming a plurality of ball grid array (BGA) bonding pads at a lower surface of the first dielectric layer;

forming a lower two-dimensional identification (2DID) pad adjacent the plurality of BGA bonding pads at the lower surface of the first dielectric layer; and forming a lower surface-mounted device (SMD) pad adjacent the plurality of BGA bonding pads at the lower surface of the first dielectric layer.

20. A package structure comprising:

a package substrate, comprising:

a dielectric layer structure including a first dielectric layer and a second dielectric layer;

a plurality of ball grid array (BGA) bonding pads located at a lower surface of the first dielectric layer;

a plurality of metal pillars located on an upper surface of the second dielectric layer, wherein the plurality of metal pillars comprise:

a plurality of C4 metal bumps;

a metal dam adjacent the plurality of C4 metal bumps on the upper surface of the second dielectric layer; and a plurality of chip-scale package pads adjacent the metal dam on the upper surface of the second dielectric layer, wherein a diameter of the plurality of chip-scale package pads is greater than a diameter of the plurality of C4 metal bumps; and a metal interconnect structure extending from the BGA bonding pads to the plurality of metal pillars and including a plurality of first metal vias in the first dielectric layer and a plurality of second metal vias in the second dielectric layer, wherein the plurality of first metal vias and the plurality of second metal vias have a cross-sectional diameter that decreases in a direction from the second dielectric layer to the first dielectric layer;

an interposer module on the plurality of C4 metal bumps, wherein the interposer module includes an interposer and a plurality of semiconductor devices on the interposer, and wherein the plurality of semiconductor devices are electrically coupled to the BGA bonding pads through the metal interconnect structure;

a chip-scale package on the plurality of chip-scale package pads and electrically coupled to the BGA bonding pads through the metal interconnect structure; and a package lid located over the interposer module and the chip-scale package and including a package lid foot portion attached to the package substrate.

* * * * *